US012580155B2

(12) United States Patent (10) Patent No.: US 12,580,155 B2
Guo et al. (45) Date of Patent: Mar. 17, 2026

(54) LEARNING BASED TUNING IN A RADIO FREQUENCY PLASMA PROCESSING CHAMBER

(71) Applicant: Applied Materials, Inc., Santa Clara, CA (US)

(72) Inventors: Yue Guo, Redwood City, CA (US); Kartik Ramaswamy, San Jose, CA (US); Yang Yang, San Diego, CA (US)

(73) Assignee: Applied Materials, Inc., Santa Clara, CA (US)

( * ) Notice: Subject to any disclaimer, the term of this patent is extended or adjusted under 35 U.S.C. 154(b) by 487 days.

(21) Appl. No.: 18/076,725

(22) Filed: Dec. 7, 2022

(65) Prior Publication Data

US 2024/0194447 A1 Jun. 13, 2024

(51) Int. Cl.
*H01J 37/32* (2006.01)
(52) U.S. Cl.
CPC .. *H01J 37/32183* (2013.01); *H01J 37/32128* (2013.01); *H01J 37/32146* (2013.01)
(58) Field of Classification Search
None
See application file for complete search history.

(56) References Cited

U.S. PATENT DOCUMENTS

2021/0327684 A1* 10/2021 Bhutta ............... H01J 37/3299
2023/0377843 A1* 11/2023 Koshimizu ......... H01L 21/3065
2024/0222080 A1* 7/2024 Kosaka ............. H01J 37/32082

* cited by examiner

*Primary Examiner* — Kenneth B Wells
(74) *Attorney, Agent, or Firm* — Patterson + Sheridan, LLP

(57) ABSTRACT

Some embodiments are directed to a method of processing a substrate in a plasma processing system. The method generally includes tuning a first capacitor and a second capacitor of a tuning circuit to match a first impedance corresponding to a first stage of a waveform, while a frequency of a radio frequency (RF) generator is preset to a first frequency; tuning a third capacitor of the tuning circuit and the frequency of the RF generator to match a second impedance corresponding to a second stage of the waveform, wherein the frequency of the RF generator is tuned to a second frequency; recording setting values of the first frequency and the second frequency that match different impedances at different stages of the waveform; and switching between the first frequency and the second frequency to match the different impedances at the different stages of the waveform.

20 Claims, 12 Drawing Sheets

700

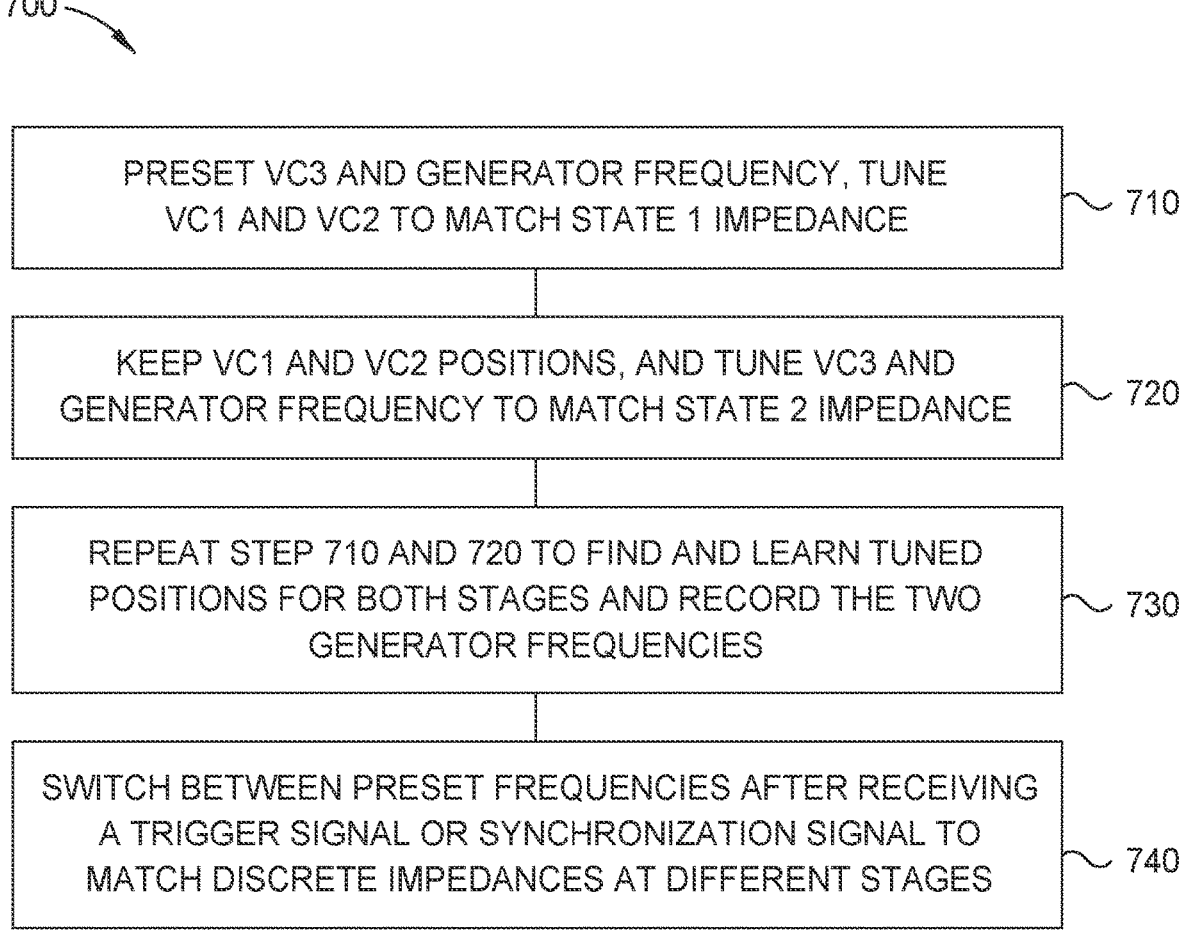

PRESET VC3 AND GENERATOR FREQUENCY, TUNE VC1 AND VC2 TO MATCH STATE 1 IMPEDANCE ~ 710

KEEP VC1 AND VC2 POSITIONS, AND TUNE VC3 AND GENERATOR FREQUENCY TO MATCH STATE 2 IMPEDANCE ~ 720

REPEAT STEP 710 AND 720 TO FIND AND LEARN TUNED POSITIONS FOR BOTH STAGES AND RECORD THE TWO GENERATOR FREQUENCIES ~ 730

SWITCH BETWEEN PRESET FREQUENCIES AFTER RECEIVING A TRIGGER SIGNAL OR SYNCHRONIZATION SIGNAL TO MATCH DISCRETE IMPEDANCES AT DIFFERENT STAGES ~ 740

FIG. 7

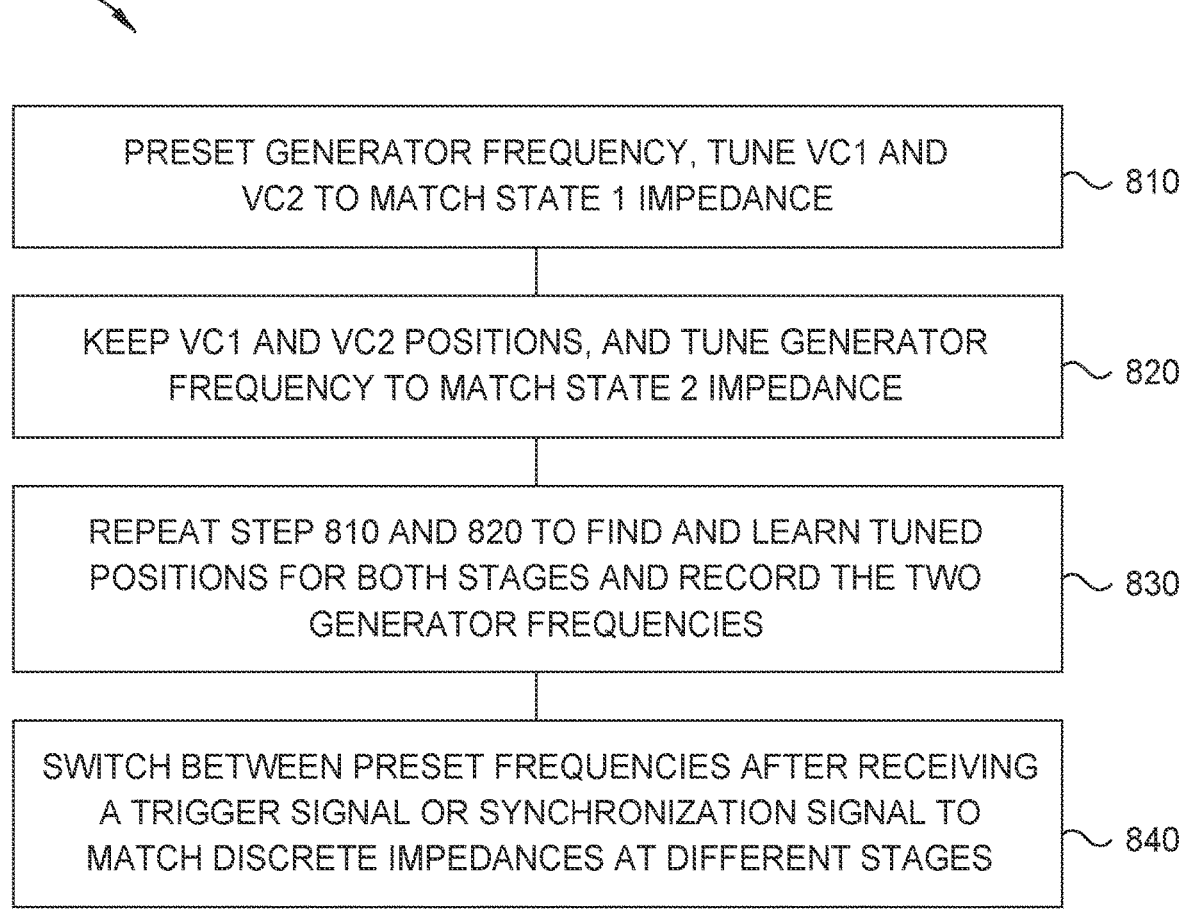

800

PRESET GENERATOR FREQUENCY, TUNE VC1 AND
VC2 TO MATCH STATE 1 IMPEDANCE — 810

KEEP VC1 AND VC2 POSITIONS, AND TUNE GENERATOR
FREQUENCY TO MATCH STATE 2 IMPEDANCE — 820

REPEAT STEP 810 AND 820 TO FIND AND LEARN TUNED
POSITIONS FOR BOTH STAGES AND RECORD THE TWO
GENERATOR FREQUENCIES — 830

SWITCH BETWEEN PRESET FREQUENCIES AFTER RECEIVING
A TRIGGER SIGNAL OR SYNCHRONIZATION SIGNAL TO
MATCH DISCRETE IMPEDANCES AT DIFFERENT STAGES — 840

FIG. 8

LEARNING BASED TUNING IN A RADIO FREQUENCY PLASMA PROCESSING CHAMBER

BACKGROUND

Field

Embodiments of the present invention generally relate to a system and methods used in semiconductor device manufacturing. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in a processing chamber and ions from the plasma are accelerated towards a surface of a substrate to form openings in a material layer disposed beneath a mask layer formed on the surface of the substrate.

A typical RIE plasma processing chamber includes a radio frequency (RF) bias generator, which supplies an RF voltage to a power electrode. In a capacitive coupled gas discharge, the plasma is created by using an RF generator that is coupled to the power electrode that is disposed within an electrostatic chuck (ESC) assembly or within another portion of the processing chamber. Typically, an RF matching network ("RF match") tunes an RF waveform provided from the RF generator to deliver RF power to an apparent load of 500 to minimize the reflected power and maximize the power delivery efficiency. If an impedance of the load is not properly matched to an impedance of a source (e.g., the RF generator), a portion of the forward delivered RF waveform can reflect back in an opposite direction along a same transmission line.

A number of plasma processes also utilize DC voltage pulsing schemes to control the plasma sheath disposed over the substrate that is being processed. During operation, the DC voltage pulses cause a generated plasma sheath to toggle between states that includes a thick plasma sheath and state where no plasma sheath exists. Typical, DC pulsing techniques are configured to deliver voltage pulses at a frequency greater than 100 kHz (e.g., 400 kHz). The toggling of the plasma sheath due to the delivered DC pulsed voltage waveform results in the plasma load having different impedance values over time. It has been found that the interaction between the RF waveform and DC pulsed voltage waveform that are simultaneously provided during the plasma processing can lead to differing plasma processing results due in large part to the RF matching portion of the RF power delivery system's inability to adjust the RF matching point to account for the rapidly changing plasma load impedance values over time.

Conventional impedance matching components and matching processes are unable to keep up with the rapid changes in magnitude of the plasma load impedance, thus causing the RF match to find undesirable matching points that typically leads to the generation of varying amounts of RF power that are actually delivered to the plasma load due to 1) inter-modulation distortion (IMD) of the RF signal, and 2) undesirably high reflected RF powers found at harmonics of the driven RF frequency. The inter-modulation distortion created by the interaction between the RF and DC pulsed voltage waveforms causes the amplitude of at least the RF signal to vary over time. The interaction or intermodulation between the RF and DC pulsed voltage waveforms causes additional undesirable waveform components to form at frequencies that are not just at harmonic frequencies (i.e., integer multiples) of the interacting signals, such as either of the RF or DC pulsed waveforms. The generation of the IMD components in a power delivery system will reduce the actual forward RF power that is delivered to the plasma load. Due at least to unavoidable differences in processing chamber power delivery configurations and differences in the power delivery components, the rapidly changing plasma load impedance values cause undesirable differences in the plasma processing results seen in a single plasma processing chamber, seen in similarly configured processing chambers of a single processing system, and also seen in similarly configured plasma processing chambers within different plasma processing systems within a semiconductor fabrication site. Moreover, the generated IMD components are also not easily accounted for in most power delivery systems due to the broad range of frequencies that can develop during plasma processing in the same or different processing chambers and thus will cause unexpected variations in the power actually delivered to the plasma load during plasma processing.

Thus, there is a need in the art for plasma processing devices and biasing methods that are at least able to resolve these issues outlined above.

SUMMARY

Embodiments provided herein generally include apparatus, plasma processing systems and methods for switching impedance tuning in a radio frequency (RF) plasma processing system for ultra-fast impedance matching.

Some embodiments are directed to a method of processing a substrate in a plasma processing system. The method generally includes tuning a first capacitor and a second capacitor of a tuning circuit to match a first impedance corresponding to a first stage of a waveform, while a frequency of an RF generator is preset to a first frequency; tuning a third capacitor of the tuning circuit and the frequency of the RF generator to match a second impedance corresponding to a second stage of the waveform, wherein the frequency of the RF generator is tuned to a second frequency; recording setting values of the first frequency and the second frequency that match different impedances at different stages of the waveform; and switching between the first frequency and the second frequency to match the different impedances at the different stages of the waveform.

Embodiments of the disclosure include a plasma processing chamber comprising a match comprising a tuning circuit that comprises a first capacitor and a second capacitor, an RF generator having an RF power output and coupled to a first electrode within the plasma processing chamber, a controller, and a memory for storing a program to be executed in the controller. The program comprises instructions when executed cause the following: tuning a first capacitor and a second capacitor of a tuning circuit to match a first impedance corresponding to a first stage of a waveform, while a frequency of a radio frequency (RF) generator is preset to a first frequency; tuning a third capacitor of the tuning circuit and the frequency of the RF generator to match a second impedance corresponding to a second stage of the waveform, wherein the frequency of the RF generator is tuned to a second frequency; recording setting values of the first frequency and the second frequency that match different impedances at different stages of the waveform, and switching between the first frequency and the second frequency to match the different impedances at the different stages of the waveform.

Embodiments of the disclosure include a method of processing a substrate in a plasma processing system, comprising: tuning a first capacitor and a second capacitor of a tuning circuit to match a first impedance corresponding to a first stage of a waveform, while a frequency of a radio frequency (RF) generator is preset to a first frequency; tuning a third capacitor of the tuning circuit and the frequency of the RF generator to match a second impedance corresponding to a second stage of the waveform, wherein the frequency of the RF generator is tuned to a second frequency; recording setting values of the first frequency and the second frequency that match different impedances at different stages of the waveform; and switching between the first frequency and the second frequency to match the different impedances at the different stages of the waveform while the first capacitor and the second capacitor are tuned to match the first impedance and the third capacitor is tuned to match the second impedance.

Embodiments of the disclosure may further include a plasma processing chamber comprising a match comprising a tuning circuit that comprises a first capacitor and a second capacitor, an RF generator having an RF power output and coupled to a first electrode within the plasma processing chamber, a controller, and a memory for storing a program to be executed in the controller. The program comprises instructions when executed cause the following: tuning a first capacitor and a second capacitor of a tuning circuit to match a first impedance corresponding to a first stage of a waveform, while a frequency of a radio frequency (RF) generator is preset to a first frequency; tuning a third capacitor of the tuning circuit and the frequency of the RF generator to match a second impedance corresponding to a second stage of the waveform, wherein the frequency of the RF generator is tuned to a second frequency; recording setting values of the first frequency and the second frequency that match different impedances at different stages of the waveform; and switching between the first frequency and the second frequency to match the different impedances at the different stages of the waveform while the first capacitor and the second capacitor are tuned to match the first impedance and the third capacitor is tuned to match the second impedance.

Embodiments of the disclosure may further include a method of processing a substrate in a plasma processing system, comprising: tuning a first capacitor and a second capacitor of a tuning circuit to match a first impedance corresponding to a first stage of a waveform, while a frequency of a radio frequency (RF) generator is preset to a first frequency; tuning the frequency of the RF generator to match a second impedance corresponding to a second stage of the waveform, wherein the frequency of the RF generator is tuned to a second frequency, and the first stage and the second stage are different stages of the waveform; recording setting values of the first frequency and the second frequency that match the first impedance and second impedance, respectively; and switching between the first frequency and the second frequency to match the different impedances at the different stages of the waveform using the settings of the first capacitor and the second capacitor set by the tuning of first capacitor and the second capacitor to match the first impedance.

Embodiments of the disclosure may further include a method of processing a substrate in a plasma processing system, comprising: tuning a first capacitor and a second capacitor of a tuning circuit to match a first impedance corresponding to a first stage of a waveform, while a frequency of a radio frequency (RF) generator is preset to a first frequency; tuning a third capacitor of the tuning circuit and the frequency of the RF generator to match a second impedance corresponding to a second stage of the waveform, wherein the frequency of the RF generator is tuned to a second frequency, and the first stage and the second stage are different stages of the waveform; recording setting values of the first frequency and the second frequency that match the first impedance and second impedance, respectively; and switching between the first frequency and the second frequency to match the different impedances at the different stages of the waveform using the settings of the first capacitor, the second capacitor and the third capacitor set by the tuning of first capacitor and the second capacitor to match the first impedance and the tuning of third capacitor to match the second impedance.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 7 is a process flow diagram illustrating a method 700 for learning-based impedance tuning, in accordance with certain aspects of the present disclosure.

FIG. 8 is a process flow diagram illustrating a method 800 for learning-based impedance tuning, in accordance with certain aspects of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a system used in a semiconductor device manufacturing process. More specifically, embodiments provided herein generally include apparatus and methods for switching impedance tuning in a radio frequency (RF) plasma processing system for ultra-fast impedance matching (e.g., to match an impedance of a plasma load to an impedance of an RF source such as an RF generator).

In the RF plasma processing system, a plasma load impedance varies with multilevel pulse states. In one example, the plasma load impedance may vary with the multilevel pulse states due to different power levels. In another example, the plasma load impedance may vary with the multilevel pulse states due to combinations of RF powers and pulsed voltage (PV) waveforms. The distinct impedance states may be seen in an RF pulse cycle or a PV waveform cycle. Usually, an RF matching network may be implemented to match distinct impedances, however, a conventional RF matching network cannot match to two or more distinct impedances at a same time, and therefore periodic reflected power spikes can happen from the imperfect impedance matched stage. The periodic reflected power spikes may cause unexpected variations in the power delivered to the plasma load during plasma processing.

Techniques described herein may be used to match fast impedance changes in RF power pulsing, advanced PV waveform, or plasma striking. For example, the fast impedance changes (e.g., two or more distinct and discrete impedances) within a PV waveform cycle, a single-level pulse or a multi-level pulse may be matched using a pi-network tuning circuit and a learning based switching frequency tuning.

The techniques described herein provide several advantages. For example, the techniques provide ultra-fast tuning speed to match all impedance states at a same time, and a minimum reflected power spike can be achieved (e.g., when using multi-level pulsing and PV waveforms). Accordingly, there will be less unexpected variations in the power delivered to the plasma load during the plasma processing.

Plasma Processing System Examples

Figure 1A:
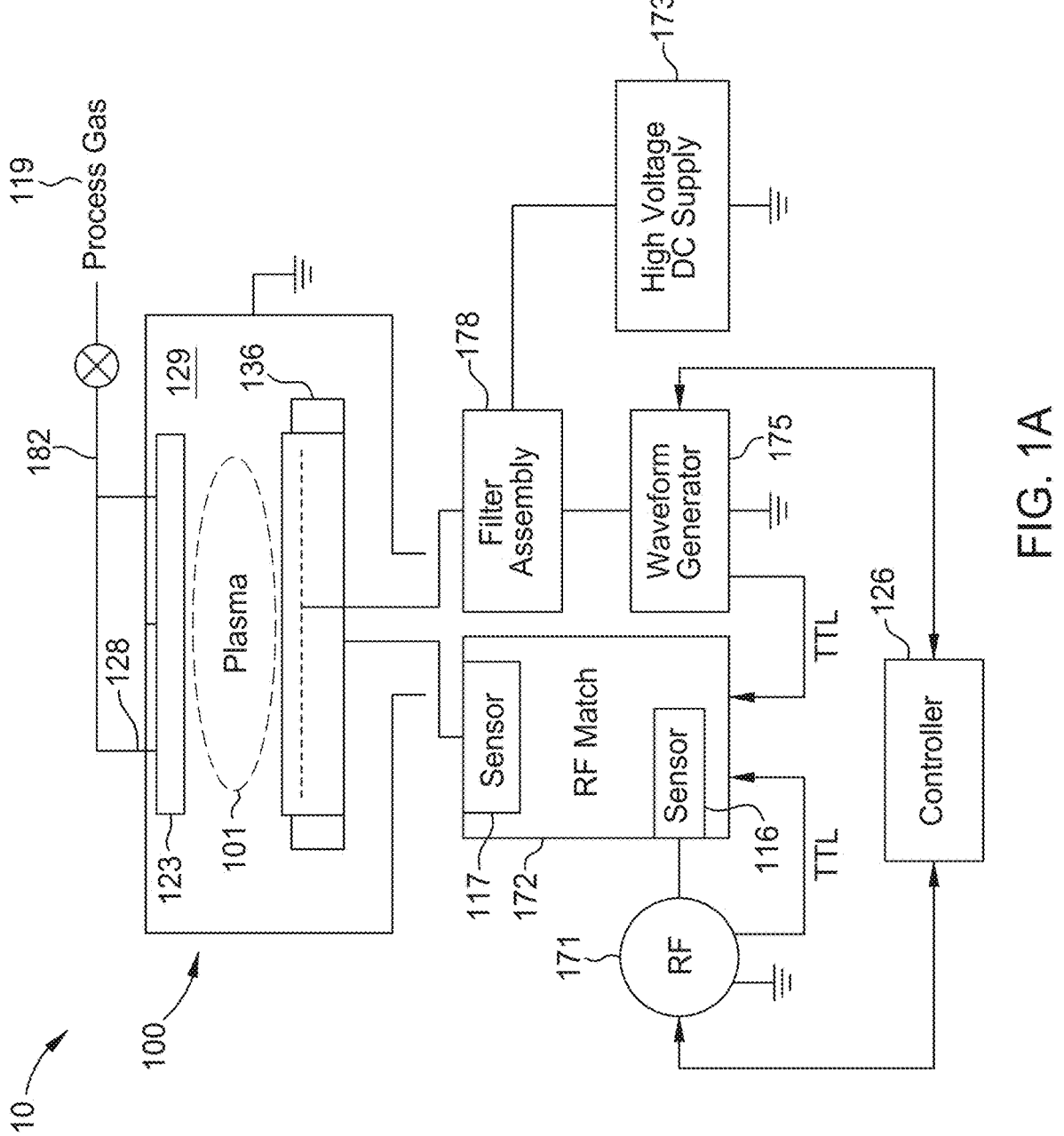
FIG. 1A is a schematic representation of a plasma processing system, in accordance with certain aspects of the present disclosure.

FIG. 1A is a schematic representation of a plasma processing system. The plasma processing system 10 is configured for plasma-assisted etching processes, such as a reactive ion etch (RIE) plasma processing. The plasma processing system 10 can also be used in other plasma-assisted processes, such as plasma-enhanced deposition processes (for example, plasma-enhanced chemical vapor deposition (PECVD) processes, plasma-enhanced physical vapor deposition (PEPVD) processes, plasma-enhanced atomic layer deposition (PEALD) processes, plasma treatment processing, plasma-based ion implant processing, or plasma doping (PLAD) processing. In one configuration, as shown in FIG. 1A, the plasma processing system 10 is configured to form a capacitive coupled plasma (CPP). However, in some embodiments, a plasma may alternately be generated by an inductively coupled source disposed over a processing region of the plasma processing system 10.

The plasma processing system 10 includes a processing chamber 100, a substrate support assembly 136, a gas delivery system 182, a high DC voltage supply 173, a radio frequency (RF) generator 171, and an RF match 172 (e.g., RF impedance matching network). A chamber lid 123 includes one or more sidewalls and a chamber base that are configured to withstand the pressures and energy applied to them while a plasma 101 is generated within a vacuum environment maintained in a processing volume 129 of the processing chamber 100 during processing.

The gas delivery system 182, which is coupled to the processing volume 129 of the processing chamber 100 is configured to deliver at least one processing gas from at least one gas processing source 119 to the processing volume 129 of the processing chamber 100. The gas delivery system 182 includes the processing gas source 119 and one or more gas inlets 128 positioned through the chamber lid 123. The gas inlets 128 are configured to deliver one or more processing gasses to the processing volume 129 of the processing chamber 100.

The processing chamber 100 includes an upper electrode (e.g., the chamber lid 123) and a lower electrode (e.g., the substrate support assembly 136) positioned in the processing volume 129 of the processing chamber 100. The upper and lower electrodes face one another. In one embodiment, the RF generator 171 is electrically coupled to the lower electrode. The RF generator 171 is configured to deliver an RF signal to ignite and maintain the plasma 101 between the upper and lower electrodes. In some alternative configurations, the RF generator 171 can also be electrically coupled to the upper electrode. For example, the RF generator 171 may deliver an RF source power to an RF baseplate within a cathode assembly (e.g., in the substrate support assembly 136) for plasma production, whereas the upper electrode is grounded. A center frequency of the RF source power can be from 13.56M to very high frequency band such as 60M, 120M or 162M. In some examples, the RF source power can also be delivered through the upper electrode. The RF source power can be operated in a continuous mode or a pulsed mode. A pulsing frequency is from 100 Hz to 10 KHz, and duty cycles are ranging from 5% to 95%. The RF generator 171 has a frequency tuning capability and can adjust its RF power frequency within e.g., ±5% or ±10%. In some embodiments, the RF generator 171 switches the RF power frequency at a predefined speed (e.g., two nanoseconds, fifty nanoseconds, etc.).

The substrate support assembly 136 may be coupled to the high voltage DC supply 173 that supplies a chucking voltage thereto. The high voltage DC supply 173 may be coupled to a filter assembly 178 that is disposed between the high DC voltage supply 173 and the substrate support assembly 136. The filter assembly 178 is configured to electronically isolate the high voltage DC supply 173 during plasma processing. In one configuration, a static DV voltage is between about −5000V and about 5000V, and is delivered using an electrical conductor (such as a coaxial power delivery line). The filter assembly 178 may include multiple filtering components or a single common filter.

The substrate support assembly 136 is coupled to a pulsed voltage (PV) waveform generator 175 configured to supply a PV to bias the substrate support assembly 136. The PV waveform generator 175 is coupled to the filter assembly 178. The filter assembly 178 is disposed between the PV waveform generator 175 and the substrate support assembly 136. The filter assembly 178 is configured to electronically isolate the PV waveform generator 175 during plasma processing.

The substrate support assembly 136 is coupled to the RF generator 171 configured to deliver an RF signal to the processing volume 129 of the processing chamber 100. The RF generator 171 is electronically coupled to the RF match 172 disposed between the RF generator 171 and the processing volume 129 of the processing chamber 100. For example, the RF match 172 is an electrical circuit used between the RF generator 171 and a plasma reactor (e.g., the processing volume 129 of the processing chamber 100) to optimize power delivery efficiency. One or more RF filters (e.g., within the RF match 172) are designed to only allow powers in a selected frequency range, and to isolate RF power supplies from each other. In some cases, a bandwidth of an RF filter has to be larger than a frequency tuning range of the RF generator 171.

During the plasma processing, the RF generator 171 delivers an RF signal to the substrate support assembly 136 via the RF match 172. For example, the RF signal is applied to a load (e.g., gas) in the processing volume 129 of the processing chamber 100. If an impedance of the load is not properly matched to an impedance of a source (e.g., the RF generator 171), a portion of a waveform can reflect back in an opposite direction. Accordingly, to prevent a substantial portion of the waveform from reflecting back, it is necessary to find a match impedance (e.g., a matching point) by adjusting one or more components of the RF match 172 as the source and load impedances change.

The RF match 172 is electrically coupled to the RF generator 171, the substrate support assembly 136, and the PV waveform generator 175. The RF match 172 is configured to receive a synchronization signal from either or both of the RF generator 171 and the PV waveform generator 175.

The RF generator 171 and the PV waveform generator 175 are each directly coupled to a system controller 126. The system controller 126 synchronizes the respectively generated RF signal and PV waveform.

Voltage and current sensors can be placed at an input and/or output of the RF match 172 to measure impedance and other parameters. These sensors can be synchronized using an external transistor-transistor logic (TTL) synchronization signal from an advanced waveform generator and/or RF generators or using measured voltage and current data to determine timing internally. For example, an output sensor 117 is configured to measure the impedance of the plasma processing chamber 100, and other characteristics such as the voltage, current, harmonics, phase, and/or the like. An input sensor 116 is configured to measure the impedance of the RF generator 171 and other characteristics such as the voltage, current, harmonics, phase, and/or the like. Based on either the synchronization signals or the characteristics of the plasma processing chamber 100, the RF match 172 is able to capture fast impedance changes and optimize impedance matching.

The PV waveform generator 175 is used to supply a PV waveform and/or a tailored voltage waveform, which is a sum of harmonic frequencies associated with the waveform. The PV waveform generator 175 may output a synchronization TTL signal to the RF match 172. The voltage waveform is coupled to a bias electrode (e.g., a bias electrode 104 shown in FIG. 1B) through the filter assembly 178. The high DC voltage supply 173 is applied to chuck a wafer during a process for a thermal control. In some cases, there can be a third electrode at an edge of the cathode assembly for edge uniformity control.

Figure 1B:
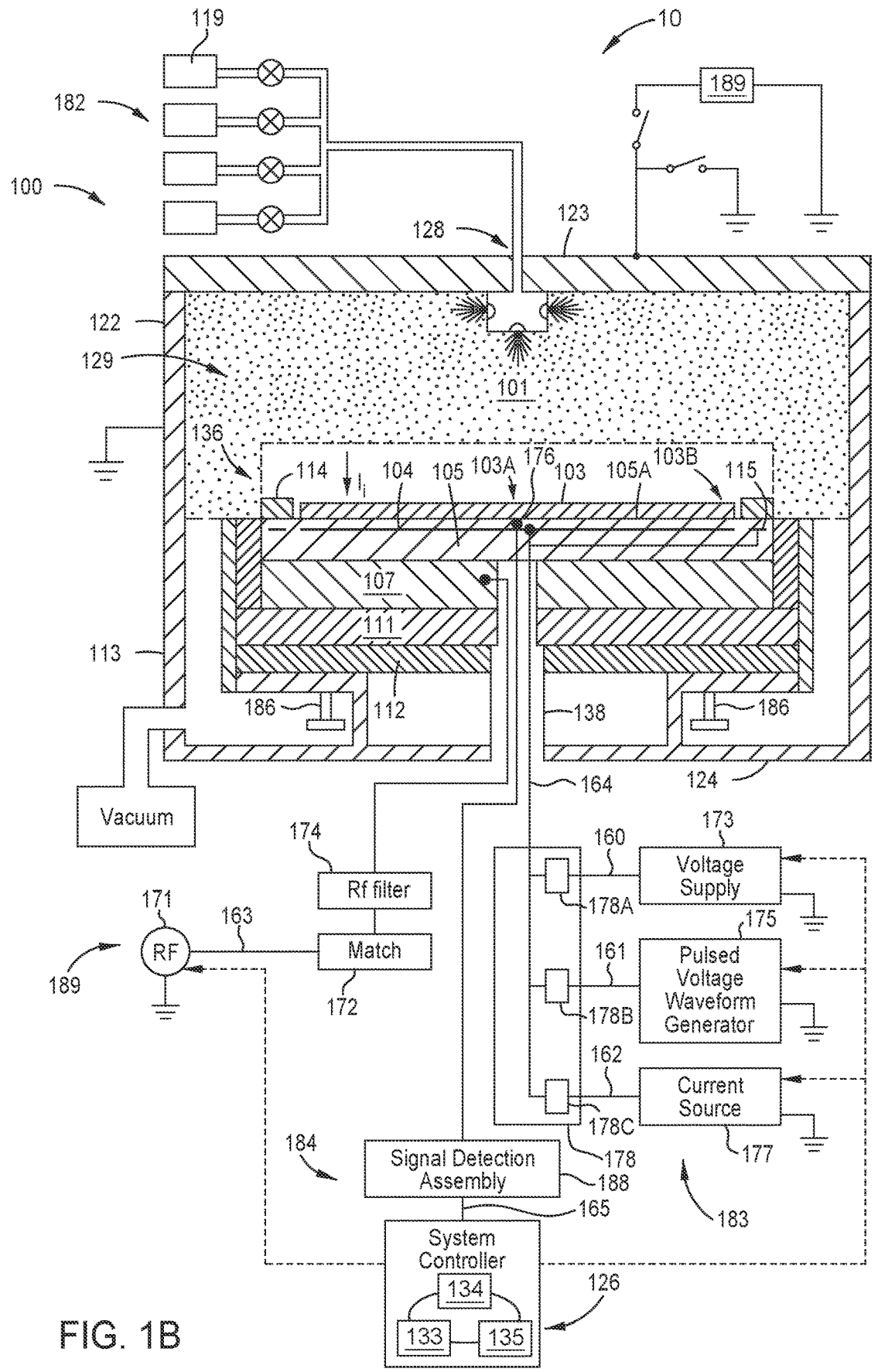
FIG. 1B is a schematic detailed cross-sectional view of the plasma processing system, in accordance with certain aspects of the present disclosure.

FIG. 1B is a schematic detailed cross-sectional view of the plasma processing system 10. As shown in FIG. 1B, the plasma processing system 10 is configured to form a CPP. However, in some embodiments, the plasma 101 may alternately be generated by an inductively coupled source disposed over the processing region of the plasma processing system 10. In this configuration, a coil may be placed on top of a ceramic lid (e.g., vacuum boundary) of the plasma processing chamber 100.

The plasma processing system 10 includes the processing chamber 100, the substrate support assembly 136, the gas delivery system 182, a DC power system 183, an RF power system 189, and the system controller 126. The processing chamber 100 includes a chamber body 113 that includes the chamber lid 123, one or more sidewalls 122, and a chamber base 124. The chamber lid 123, the one or more sidewalls 122, and the chamber base 124 collectively define the processing volume 129 of the processing chamber 100. The one or more sidewalls 122 and the chamber base 124 include materials (such as aluminum, aluminum alloys, or stainless steel alloys) that are sized and shaped to form a structural support for elements of the processing chamber 100 and are configured to withstand the pressures and added energy applied to them while the plasma 101 is generated within a vacuum environment maintained in the processing volume 129 of the processing chamber 100 during processing. A substrate 103 is loaded into, and removed from, the processing volume 129 of the processing chamber 100 through an opening (not shown) in one of the sidewalls 122. The opening is sealed with a slit valve (not shown) during plasma processing of the substrate 103.

The gas delivery system 182, which is coupled to the processing volume 129 of the processing chamber 100 is configured to deliver at least one processing gas from at least one gas processing source 119 to the processing volume 129 of the processing chamber 100. The gas delivery system 182 includes the processing gas source 119 and one or more gas inlets 128 positioned through the chamber lid 123. The gas inlets 128 are configured to deliver one or more processing gases to the processing volume 129 of the processing chamber 100.

As noted above, the processing chamber 100 includes the upper electrode (e.g., the chamber lid 123) and the lower electrode (e.g., the substrate support assembly 136) disposed in the processing volume 129 of the processing chamber 100. The upper electrode and lower electrode are positioned to face each other. As seen in FIG. 1B, the RF generator 171 is electrically coupled to the lower electrode. The RF generator 171 is configured to deliver an RF signal to ignite and maintain the plasma 101 between the upper and lower electrodes. In some alternative configurations, the RF generator 171 can also be electrically coupled to the upper electrode.

The substrate support assembly 136 includes a substrate support 105, a substrate support base 107, an insulator plate 111, a ground plate 112, a plurality of lift pins 186, one or more substrate potential sensing assemblies 184 (e.g., including a signal detecting assembly 188), and a bias electrode 104. Each of the lift pins 186 are disposed through a through hole 185 formed in the substrate support assembly 136 and are used to facilitate the transfer of the substrate 103 to and from a substrate receiving surface 105A of the substrate support 105. The substrate support 105 is formed of a dielectric material. The dielectric material can include a bulk sintered ceramic material, a corrosion-resistant metal oxide (for example, aluminum oxide ($Al_2O_3$), titanium oxide (TiO), yttrium oxide ($Y_2O_3$), a metal nitride material (for example, aluminum nitride (AlN), titanium nitride (TiN)), mixtures thereof, or combinations thereof.

The substrate support base 107 is formed of a conductive material (for example aluminum, an aluminum alloy, or a stainless steel alloy). The substrate support base 107 is electrically isolated from the chamber base 124 by the insulator plate 111, and the ground plate 112 interposed between the insulator plate 111 and the chamber base 124. The substrate support base 107 is configured to regulate the temperature of both the substrate support 105, and the substrate 103 disposed on the substrate support 105 during substrate processing. The substrate support base 107 includes one or more cooling channels (not shown) disposed therein that are fluidly coupled to, and in fluid communication with, a coolant source (not shown), such as a refrigerant source or substrate source having a relatively high electrical resistance. The substrate support 105 includes a heater (not shown) to heat the substrate support 105 and the substrate 103 disposed on the substrate support 105.

The bias electrode 104 is embedded in a dielectric material of the substrate support 105. The bias electrode 104 is formed of one or more electrically conductive parts. The electrically conductive parts include meshes, foils, plates, or combinations thereof. The bias electrode 104 functions as a chucking pole (i.e., electrostatic chucking electrode) that is used to secure (e.g., electrostatically chuck) the substrate 103 to the substrate receiving surface 105A of the substrate support 105. A parallel plate like structure is formed by the bias electrode 104 and a layer of the dielectric material that is disposed between the bias electrode 104 and the substrate receiving surface 105A. The dielectric material can have an effective capacitance CE of between about 5 nF and about 50 nF. A layer of the dielectric material (e.g., aluminum nitride (AlN), aluminum oxide ($Al_2O_3$), etc.) has a thickness between about 0.03 mm and about 5 mm, such as between about 0.1 mm and about 3 mm, such as between about 0.1 mm and about 1 mm, or even between about 0.1 mm and 0.5 mm. The bias electrode 104 is electrically coupled to a clamping network, which provides a chucking voltage thereto. The clamping network includes the DC voltage supply 173 (e.g., a high voltage DC supply) that is coupled to a filter 178A of the filter assembly 178 that is disposed between the DC voltage supply 173 and the bias electrode 104. The filter 178A is a low-pass filter that is configured to block RF frequency and PV waveform signals provided by other biasing components found within the processing chamber 100 from reaching the DC voltage supply 173 during the plasma processing. The static DC voltage is between about −5000V and about 5000V, and is delivered using an electrical conductor (such as a coaxial power delivery line 106). The bias electrode 104 may bias the substrate 103 with the respect to the plasma 101 using one or more of the PV biasing schemes.

The substrate support assembly 136 includes an edge control electrode 115. The edge control electrode 115 is formed of one or more electrically conductive parts. The electrically conductive parts include meshes, foils, plates, or combinations thereof. The edge control electrode 115 is positioned below an edge ring 114 and surrounds the bias electrode 104 and/or is disposed a distance from a center of the bias electrode 104. For the processing chamber 100 that is configured to process circular substrates, the edge control electrode 115 is annular in shape, is made from a conductive material, and is configured to surround at least a portion of the bias electrode 104. As seen in FIG. 1B, the edge control electrode 115 is positioned within a region of the substrate support 105, and is biased by use of the PV waveform generator 175. The edge control electrode 115 is biased by use of a PV waveform generator that is different from the PV waveform generator 175 used for the bias electrode 104. The edge control electrode 115 is biased by splitting part of a signal provided from the PV waveform generator 175 to the bias electrode 104.

The DC power system 183 includes the DC voltage supply 173, the PV waveform generator 175, and a current source 177. The RF power system 189 includes the RF waveform generator 171, the RF matching circuit 172, and an RF filter 174. As shown in FIG. 1B, a power delivery line 163 electrically connects an output of the RF generator 171 to the RF matching circuit 172, the RF filter 174 and the substrate support base 107. As noted above, during the plasma processing, the DC voltage supply 173 provides a constant chucking voltage, while the RF generator 171 delivers the RF signal to the processing region, and the PV waveform generator 175 establishes the PV waveform at the bias electrode 104. For example, a sufficient amount of the RF power is applied to an RF bias voltage signal (which is also referred to herein as the RF waveform), and the RF waveform is provided to an electrode (e.g., the substrate support base 107) to cause the plasma 101 to be formed in the processing volume 129 of the processing chamber 100. The RF waveform has a frequency range between about 1 MHz and about 200 MHz, such as between 2 MHz and 40 MHz.

The DC power system 183 includes the filter assembly 178 to electrically isolate one or more of the components contained within the DC power system 183. A power delivery line 160 electrically connects an output of the DC voltage supply 173 to the filter assembly 178. A power delivery line 161 electrically connects the output of the PV waveform generator 175 to the filter assembly 178. A power delivery line 162 connects the output of the current source 177 to the filter assembly 178.

The current source 177 is selectively coupled to the bias electrode 104 by use of a switch (not shown) disposed in the power delivery line 162, to allow the current source 177 to deliver a desired current to the bias electrode 104 during one or more stages (e.g., ion current stage) of the voltage waveform generated by the PV waveform generator 175.

The filter assembly 178 includes multiple separate filtering components (i.e., discrete filters 178A-178C) that are each electrically coupled to an output node via a power delivery line 164. The filter assembly 178 may include one common filter electrically coupled to the output node via the power delivery line 164. The power delivery lines 160-164 include electrical conductors that include a combination of coaxial cables, such as a flexible coaxial cable that is connected in series with a rigid coaxial cable, an insulated high-voltage corona-resistant hookup wire, a bare wire, a metal rod, an electrical connector, of any combination of the above.

The system controller 126, also referred to herein as a processing chamber controller, includes a central processing unit (CPU) 133, a memory 134, and support circuits 135. The system controller 126 is used to control a process sequence used to process the substrate 103. The CPU is a computer processor configured for use in an industrial setting for controlling the processing chamber and sub-processors related thereto. The memory 134 described herein, which is generally non-volatile memory, can include random access memory, read-only memory, hard disk drive, or other suitable forms of digital storage, local or remote. The support circuits 135 are coupled to the CPU 133 and include cache, clock circuits, input/output subsystems, power supplies, and the like, and combinations thereof. Software instructions (program) and data can be coded and stored within the memory 134 for instructing a processor within the CPU 133. A software program (or computer instructions) readable by the CPU 133 in the system controller 126 determines which tasks are performable by the components in the plasma processing system 10.

The program, which is readable by the CPU 133 in the system controller 126 includes code, which, when executed by the CPU 133, performs tasks relating to the plasma processing schemes described herein. The program may include instructions that are used to control the various hardware and electrical components within the plasma processing system 10 to perform the various process tasks and various process sequences used to implement the methods described herein. The program includes instructions that are used to perform one or more of the operations described below in relation to FIGS. 5-7.

Figure 2:
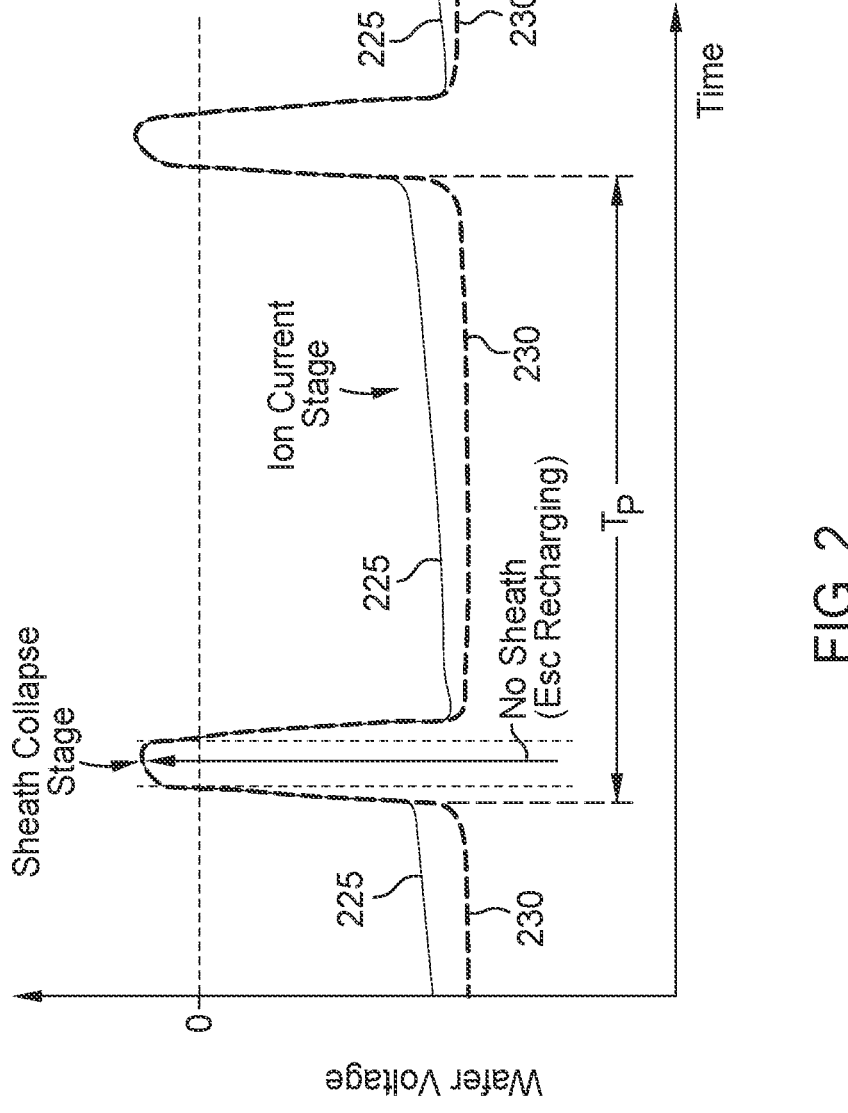
FIG. 2 shows a voltage waveform that is established on a substrate due to a voltage waveform applied to an electrode of a processing chamber, in accordance with certain aspects of the present disclosure.

FIG. 2 illustrates two separate voltage waveforms established at the substrate 103 disposed on the substrate receiving surface 105A of the substrate support assembly 136 of the processing chamber 100 due to the delivery of PV waveforms to the bias electrode 104 of the processing chamber 100. A first waveform (e.g., a waveform 225) is an example of a non-compensated PV waveform established at the substrate 103 during the plasma processing. A second waveform (e.g., a waveform 230) is an example of a compensated PV waveform established at the substrate 103 by applying a negative slope waveform to the bias electrode 104 of the processing chamber 100 during an "ion current stage" portion of the PV waveform cycle by use of the current source 177. The compensated PV waveform can alternatively be established by applying a negative voltage ramp during the ion current stage of the PV waveform generated by the PV waveform generator 175.

The waveforms 225 and 230 include two main stages: an ion current stage and a sheath collapse stage. Both portions (e.g., the ion current stage and the sheath collapse stage) of the waveforms 225 and 230, can be alternately and/or separately established at the substrate 103 during the plasma processing. At a beginning of the ion current stage, a drop in the voltage at the substrate 103 is created, due to the delivery of a negative portion of the PV waveform (e.g., the ion current portion) provided to the bias electrode 104 by the PV waveform generator 175, which creates a high voltage sheath above the substrate 103. The high voltage sheath allows the plasma generated positive ions to be accelerated towards the biased substrate 103 during the ion current stage, and thus, for RIE processes, controls the amount and characteristics of the etching process that occurs on the surface of the substrate 103 during the plasma processing. In some embodiments, it is desirable for the ion current stage to include a region of the PV waveform that achieves the voltage at the substrate 103 that is stable or minimally varying throughout the stage, as illustrated in FIG. 2 by the waveform 230. One will note that significant variations in the voltage established at the substrate 103 during the ion current stage, such as shown by the positive slope in the waveform 225, will undesirably cause a variation in the ion energy distribution (IED) and thus cause undesirable characteristics of the etched features to be formed in the substrate 103 during the RIE process.

Plasma sheath impedance varies with supplied PV waveform voltages. The RF match 172 can use either or both of the synchronization signals and/or use its internal sensors to sample impedances in different processing phases. In one example, a synchronization signal or characteristics determined by the input sensor 116 or the output sensor 117 are used to trigger the RF match 172 to determine at least two different impedances at different processing stages. Then, the RF match 172 updates its matching point based on the at least two different impedances.

Figure 3:
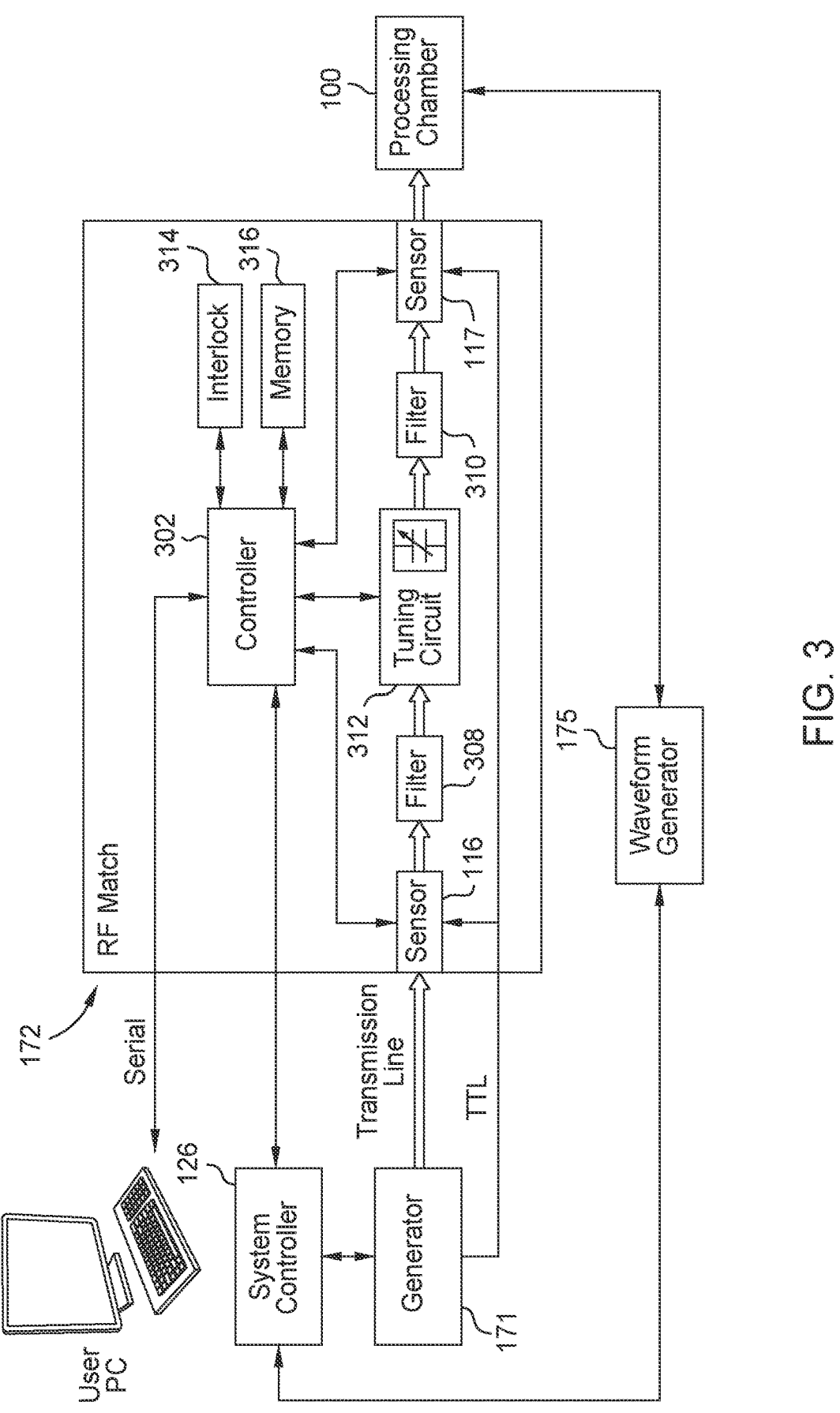
FIG. 3 is a schematic representation of a radio frequency (RF) matching network, in accordance with certain aspects of the present disclosure.

FIG. 3 is a schematic representation of an RF match 172. The RF match 172 includes a controller 302, the input sensor 116, the output sensor 117, a first RF filter 308, a second RF filter 310, a tuning circuit 312, an interlock 314, and a memory 316. The two RF filter circuits (e.g., the first RF filter 308 and the second RF filter 310) are near both an input and an output of the RF match 172. In some cases, only one RF filter may be used near the output of the RF match 172.

The RF match 172 is connected to the RF generator 171 through a 500 transmission line. The RF generator 171 may supply power at frequencies between 100 KHz and 200 MHz. The RF generator 171 has a frequency tuning capability and can adjust its RF power frequency within e.g. ±5% or ±10%. The RF generator 171 sends a TTL signal to the input sensor 116 and the output sensor 117 directly for fast response and better synchronization. The RF match 172 is configured to receive the RF waveform from the RF generator 171, tune the RF waveform to minimize the reflected power and maximize power delivery efficiency, and deliver the tuned RF waveform to the plasma chamber 100. Simultaneously, as noted above, the PV waveform generator 175 is configured to provide the PV waveform to the processing chamber 100. The RF generator 171 and the PV waveform generator 175 are both coupled to and synchronized by the controller 302.

The controller 302 may work with various communication protocols, e.g., RS-232, RS-485, USB, Ethernet, or Ethernet for Control Automation Technology (ECAT). The controller 302 may serve as a local EtherCAT master. Other components (e.g., the input sensor 116, the output sensor 117, motors) are EtherCAT slave devices, which are controlled by the controller 302.

The controller 302 may be coupled to the interlock 314, the memory 316, the tuning circuit 312, the input sensor 116, the output sensor 117, and the system controller 126. The controller 302 includes a CPU. The controller 302 is configured to control the tuning circuit 312 to change an impedance parameter of the RF match 172. In one example, the tuning circuit 312 is a T-network tuning circuit. In another example, the tuning circuit 312 is a pi-network tuning circuit. In another example, the tuning circuit 312 is an L-network tuning circuit. The tuning circuit 312 may include one or more capacitors and inductors that can be adjusted by the controller 302 to change the impedance of the RF waveform delivered to the processing chamber 100.

The system controller 126 can communicate with the RF match 172, the RF generator 171 and/or other chamber components. The controller 302 can communicate with the system controller 126 using EtherCAT. The controller 302 can do a master to slave conversion, which allows communication to the system controller 126 EtherCAT master. The controller 302 receives requests from the system controller 126, and provides feedback. Also, the system controller 126 receives forward and reflected power information from the RF generator 171 and gets data from all internal devices of the RF match 172. The RF generator 171 can also be controlled by the system controller 126 for a cooperative intelligent real time control and tuning.

The memory 316 may be programmed for long term or short term memory storage. The memory 316 described herein, which is generally non-volatile memory, can include random access memory, read-only memory, hard disk drive, or other suitable forms of digital storage, local or remote. Software instructions (program) and data can be coded and stored within the memory 316 for instructing a processor within the controller 302. A software program (or computer instructions) readable by controller 302 determines which tasks are performable by the components in the plasma processing system 10. The program, which is readable by the controller 302 includes code, which, when executed, performs tasks relating to the plasma processing schemes described herein. The program may include instructions that are used to control the RF match 172 using the methods described herein. The program includes instructions that are used to perform one or more of the operations described below in relation to FIGS. 5-7.

The interlock 314 is implemented for safety purposes to control over temperature switches, cable-in-place switches, and match-in-place switches, etc. The interlock 314 is open when failure happens, and an interlock signal will be sent from a local microcontroller to both a user laptop and the system controller 126 to shut the system off.

The RF match 172 may include a serial control port for algorithm uploading, and an external match control (e.g., by using an external software and application programming interface (API)). Automatic impedance tuning algorithms and preset variable capacitor positions are stored in the memory 316. Sensor data and tuning algorithms can be accessed from an external user laptop, which provides great flexibility to the RF match 172. Furthermore, advanced process related control algorithm can be deployed in real time. The RF match 172 can operate fully autonomously, cooperatively with the system controller 126 or manually controlled by the external user laptop.

The output sensor 117 may include a voltage sensor and/or a current sensor configured to measure the impedances or the characteristics of the plasma processing system 10 explained above. The input sensor 116 may include a voltage sensor and/or a current sensor configured to measure characteristics of the RF waveform such as voltage, current, phase, or harmonics. In some cases, only one sensor can be used at the input of the RF match 172. Sensor readings can be used in a feedback and feedforward algorithms for impedance matching.

The output sensor 117 is configured to sample a first set of impedances of the plasma processing system 10 over a first period of time and report them to the controller 302. The output sensor 117 is also configured to sample a second set of impedances of the plasma processing system 10 over a second period of time and report them to the controller 302. The first period of time may begin after a first delay that is triggered (i.e. measured) after a first portion of a waveform pulse of a synchronization signal or internally by the sensors detecting a change in a characteristic of the PV waveform or the RF waveform. The second period of time may begin after a second delay that is triggered at the same time as the first delay. The second delay is longer than the first delay.

The controller 302 uses both sets of impedances to determine a first impedance and a second impedance and combine them into a combined impedance. Then, based on the combined impedance parameter, the controller 302 adjusts the one or more capacitor(s) of the tuning circuit 312 to change the matching point of the RF match 172 so that the impedance of the generated RF waveform matches the impedance of the plasma processing system 100. Then, after adjusting the tuning circuit 312 based on the combined impedance parameter, the controller 302 may further fine tune the tuning circuit 312 based on the impedance of the RF waveform sampled by the input sensor 116.

Figure 4A:
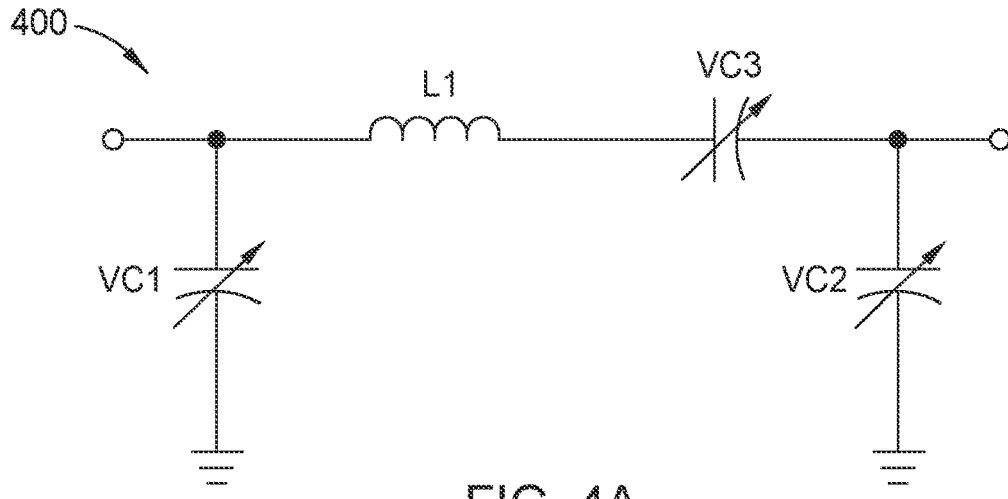
FIG. 4A is a schematic representation of a first RF tuning circuit of an RF matching network, in accordance with certain aspects of the present disclosure.

One or more tuning circuits (e.g., the tuning circuit 312) may be implemented in the RF match 172. FIG. 4A illustrates a first RF tuning circuit 400 that can be used in the RF match 172. The first RF tuning circuit 400 is a pi-network tuning circuit. The first RF tuning circuit 400 includes three capacitors (e.g., motorized variable vacuum capacitors such as a first variable capacitor (VC1), a second VC (VC2), and a third VC (VC3)) and a first inductor (e.g., L1) coupled to each other. The capacitors may be in a range from 3 pF to 5000 pF. The inductor may have a range of 0.01 uH to 1000 uH. The controller 302 may adjust the one or more capacitors to change the impedance of the RF waveform delivered to the processing chamber 100. In another example, the first RF tuning circuit 400 may be a L-network tuning circuit with the one or more capacitors. In yet another example, the first RF tuning circuit 400 may be a T-network tuning circuit with the one or more capacitors.

Figure 4B:
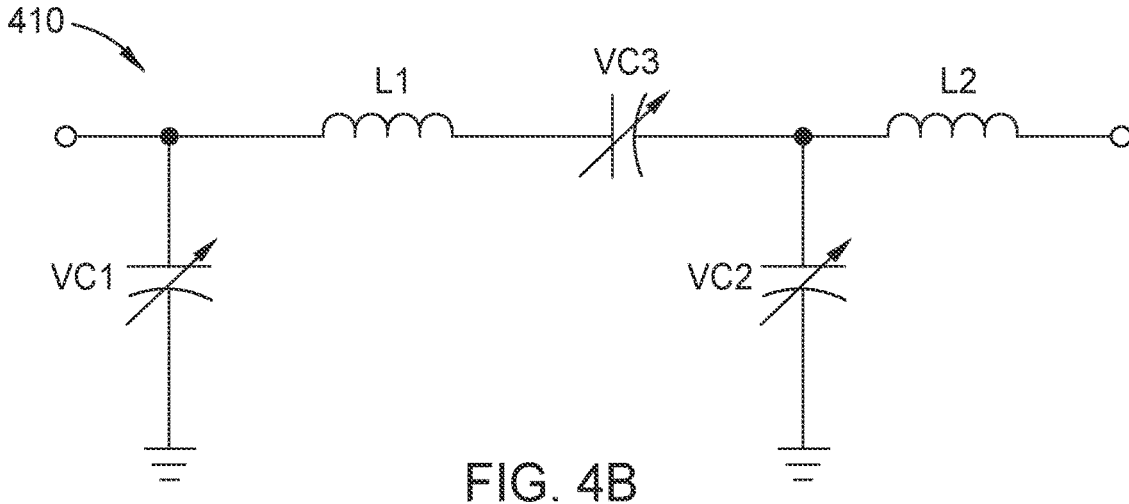
FIG. 4B is a schematic representation of a second RF tuning circuit of the RF matching network, in accordance with certain aspects of the present disclosure.

In some cases (e.g., with a lower center frequency), a second RF tuning circuit 410 shown in FIG. 4B may be implemented in the RF match 172. The second RF tuning circuit 410 is a pi-network tuning circuit. As illustrated in FIG. 4B, the second RF tuning circuit 410 includes three capacitors (e.g., VC1, VC2, and VC3) and two inductors (e.g., L1 and a second inductor L2) coupled to each other. The capacitors may be in a range from 3 pF to 5000 pF. The inductors may be in a range of 0.01 uH to 1000 uH. The controller 302 may adjust the one or more capacitors to change the impedance of the RF waveform delivered to the processing chamber 100.

In one example, the three motorized variable vacuum capacitors (e.g., in the first RF tuning circuit 400 and/or the second RF tuning circuit 410) may be replaced by three fixed vacuum capacitors. In another example, the three motorized variable vacuum capacitors (e.g., in the first RF tuning circuit 400 and/or the second RF tuning circuit 410) may be replaced by three inductors. In another example, the three motorized variable vacuum capacitors (e.g., in the first RF tuning circuit 400 and/or the second RF tuning circuit 410) may be replaced by the fixed vacuum capacitors as well as the inductors.

Figure 4C:
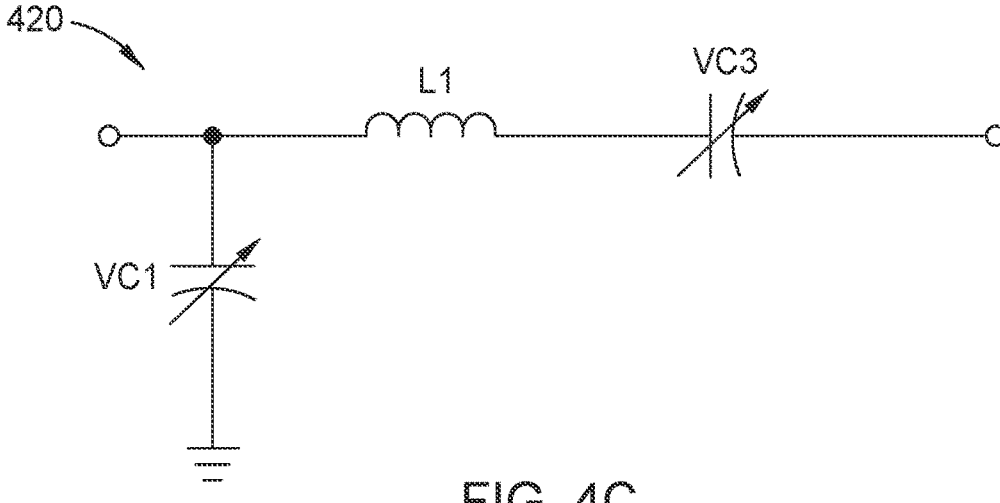
FIG. 4C is a schematic representation of a third RF tuning circuit of the RF matching network, in accordance with certain aspects of the present disclosure.

In some cases, a less complex third RF tuning circuit 420 shown in FIG. 4C may be implemented in the RF match 172. The third RF tuning circuit 420 is an L-network tuning circuit. As illustrated in FIG. 4C, the third RF tuning circuit 420 includes two capacitors (e.g., VC1 and VC3) and one inductor (e.g., inductor L1) coupled to each other. The capacitors may be in a range from 3 pF to 5000 pF. The inductor may be in a range of 0.01 uH to 1000 uH. The controller 302 may adjust the one or more capacitors to change the impedance of the RF waveform delivered to the processing chamber 100. In one example, the two motorized variable vacuum capacitors may be replaced by two variable inductors. In another example, the two motorized variable vacuum capacitors may be replaced by the fixed vacuum capacitors as well as the inductors. However, in another example, the third RF tuning circuit 400 may be a T-network tuning circuit with the one or more capacitors.

Learning Based Tuning in an RF Plasma Processing Chamber

In a radio frequency (RF) plasma processing system, a plasma load impedance may vary with pulsing power levels, bias power on and off, or pulsed voltage (PV) waveforms. For example, the plasma load impedance varies with multilevel pulse states due to different pulsing power levels or a mixture of RF power and PV waveforms. Accordingly, two or more distinct impedance states can be seen in an RF pulse cycle or a PV waveform cycle (e.g., impedance A at an ion current stage of the PV waveform and impedance B at a sheath collapse stage of the PV waveform).

The RF plasma processing system includes an RF impedance matching network, which is an electrical circuit between an RF source (e.g., an RF generator) and a plasma reactor to optimize power efficiency. At a tuned impedance matching point, a maximum power is delivered into the plasma load and a near zero power is reflected to the RF source. In order to realize automatic impedance matching, the RF impedance matching network includes motorized variable vacuum capacitors that are adjusted (e.g., to change the impedance of an RF waveform). However, since the motorized/mechanical variable vacuum capacitors cannot move fast (e.g., in sub millisecond time scale), the RF impedance matching network cannot tune to the distinct impedance states (e.g., two or more impedances at a same time) in a cycle of the PV waveform or the multi-level RF pulsing.

In some cases, a frequency tuning can be used for fast impedance tuning (e.g., sub millisecond impedance tuning). However, in the RF impedance matching network (e.g., L-network tuning circuit), the frequency tuning only provides limited tuning capability. For example, only an imaginary part of the plasma load impedance can be effectively affected by the frequency tuning, whereas the real part of the plasma load impedance has trivial responses to the frequency tuning.

Accordingly, the RF impedance matching network (e.g., based on the motorized variable vacuum capacitors and/or the frequency tuning) cannot match to the two or more distinct impedances (e.g., in the cycle of the PV waveform) at the same time, and therefore, periodic reflected power spikes can happen from an imperfect impedance matched stage. The periodic reflected power spikes may cause unexpected variations in the power delivered to a plasma load during plasma processing.

Embodiments provided herein include apparatus and methods for switching impedance tuning in the RF plasma processing system (e.g., for ultra-fast impedance matching). The apparatus and methods can be implemented to match fast impedance changes in an RF power pulsing, advanced PV waveform, or plasma striking. For example, the fast impedance changes (e.g., within a PV waveform cycle, a single-level pulse or a multi-level pulse) can be matched using a pi-network tuning circuit and a learning based switching frequency tuning. For example, when applying the frequency tuning with the pi-network tuning circuit, both real and imaginary parts of impedance can be affected by the frequency tuning, and a minimum reflected power can be achieved for all impedance states at the same time (e.g., when using multi-level pulsing and PV waveforms).

Accordingly, there will be less unexpected variations in the power delivered to the plasma load during the plasma processing.

In some cases, the apparatus and methods for switching impedance tuning in the RF plasma processing system may be implemented for a plurality of distinct and discrete impedances. For example, during an impedance matching process, an RF generator of the RF plasma processing system may record and switch between two or more frequencies to tune to two or more discrete impedances (e.g., in microseconds time scale) without moving one or more variable capacitors of a tuning circuit of the RF plasma processing system.

In some cases, the apparatus and methods may use an L-network tuning circuit for switching impedance tuning in the RF plasma processing system. For example, during an impedance matching process, two or more discrete impedances may be matched by changing an RF generator frequency based on one or more selected positions of a plurality of variable capacitors of a tuning circuit of the RF plasma processing system.

In some cases, a learning-based switching impedance tuning method may be implemented in the RF plasma processing system (e.g., for ultra-fast impedance matching). The learning-based switching impedance tuning method is applicable for various applications with a plurality of distinct and discrete impedances at different stages. For example, when multi-level pulsing is used, the learning-based switching impedance tuning method is useful for fast impedance tuning at different RF power levels. The fast impedance tuning at the different RF power levels reduces a transition time, so there is less unexpected variations in the power delivered to the plasma load during the plasma processing in the RF plasma processing system.

Figure 5A:
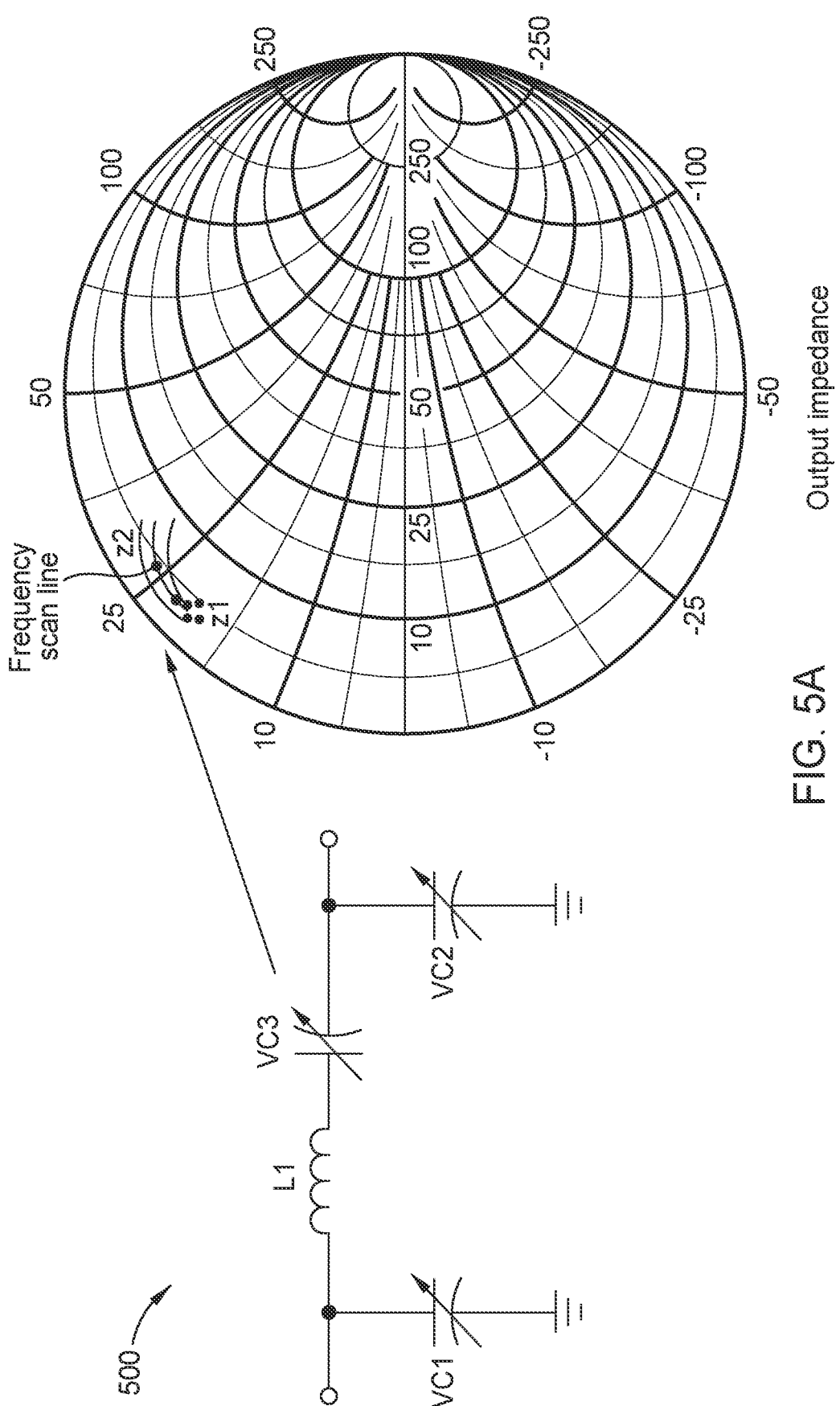
FIG. 5A illustrates a pi-network tuning circuit, in accordance with certain aspects of the present disclosure.

FIG. 5A illustrates a pi-network tuning circuit 500 (e.g., the first RF tuning circuit 400). The pi-network tuning circuit 500 includes one or more capacitors and one or more inductors coupled to each other. The one or more inductors include a first inductor (L1). The L1 may be in a range of 0.01 uH to 1000 uH. In some cases, there may be more than one inductor in the pi-network tuning circuit 500. In some cases, there may be no inductor in the pi-network tuning circuit 500. The one or more capacitors include a first variable capacitor (VC1), a second VC (VC2), and a third VC (VC3). The capacitors may be in a range from 3 pF to 5000 pF. In some cases, there may be more than three capacitors in the pi-network tuning circuit 500. In some cases, there may be less than three capacitors in the pi-network tuning circuit 500. In one example, the one or more capacitors may be variable capacitors. In another example, the one or more capacitors may be fixed capacitors. In another example, the one or more capacitors may be variable as well as fixed capacitors. In another example, the one or more capacitors may be replaced by inductors.

In the pi-network tuning circuit 500 illustrated in FIG. 5A, the L1 is coupled to the VC3. The VC1 is coupled between the L1 and an electrical ground node. The VC2 is coupled between the VC3 and the electrical ground node. The setting values of VC1, the VC2, the VC3 may be changed along with frequency switching using an RF generator (e.g., which has a frequency tuning capability and can adjust its RF power frequency within e.g., ±5% or ±10%) to match two or more distinct impedance states in the PV waveform cycle (e.g., the impedance A at the ion current stage of the PV waveform and the impedance B at the sheath collapse stage of the PV waveform) at the same time.

The VC1 and the VC2 may be tuned to a first impedance Z1. For example, a controller may tune the VC1 and the VC2 to the impedance Z1. The controller may determine the impedance Z1. For example, an output sensor may sense a first set of impedance data of the PV waveform over a first period of time and report the first set of impedance data to the controller. Based on the first set of impedance data, the controller may determine impedance Z1 to be impedance at the ion current stage of the PV waveform.

The VC3 and the frequency may be tuned to a second impedance Z2. For example, the controller may tune the VC3 and the RF generator frequency to the impedance Z2. The controller may determine the impedance Z2. For example, the output sensor may sense a second set of impedance data of the PV waveform over a second period of time and report the second set of impedance data to the controller. Based on the second set of impedance data, the controller may determine impedance Z2 to be impedance at the sheath collapse stage of the PV waveform.

In certain aspects, if a target frequency is X MHz (e.g., X=13.56 MHZ, 40 MHZ or 60 MHZ), the RF generator can adjust its RF power frequency within a range of ±5% or ±10%. In operation, the RF generator may scan the frequency within the range along a frequency scan line, such that the frequency scan line passes through the impedance Z1 and the impedance Z2 at the same time. In some cases, the frequency scan line may be used to match to two or more impedances with variable capacitors, fixed capacitors, and/or inductors.

Figure 5B:
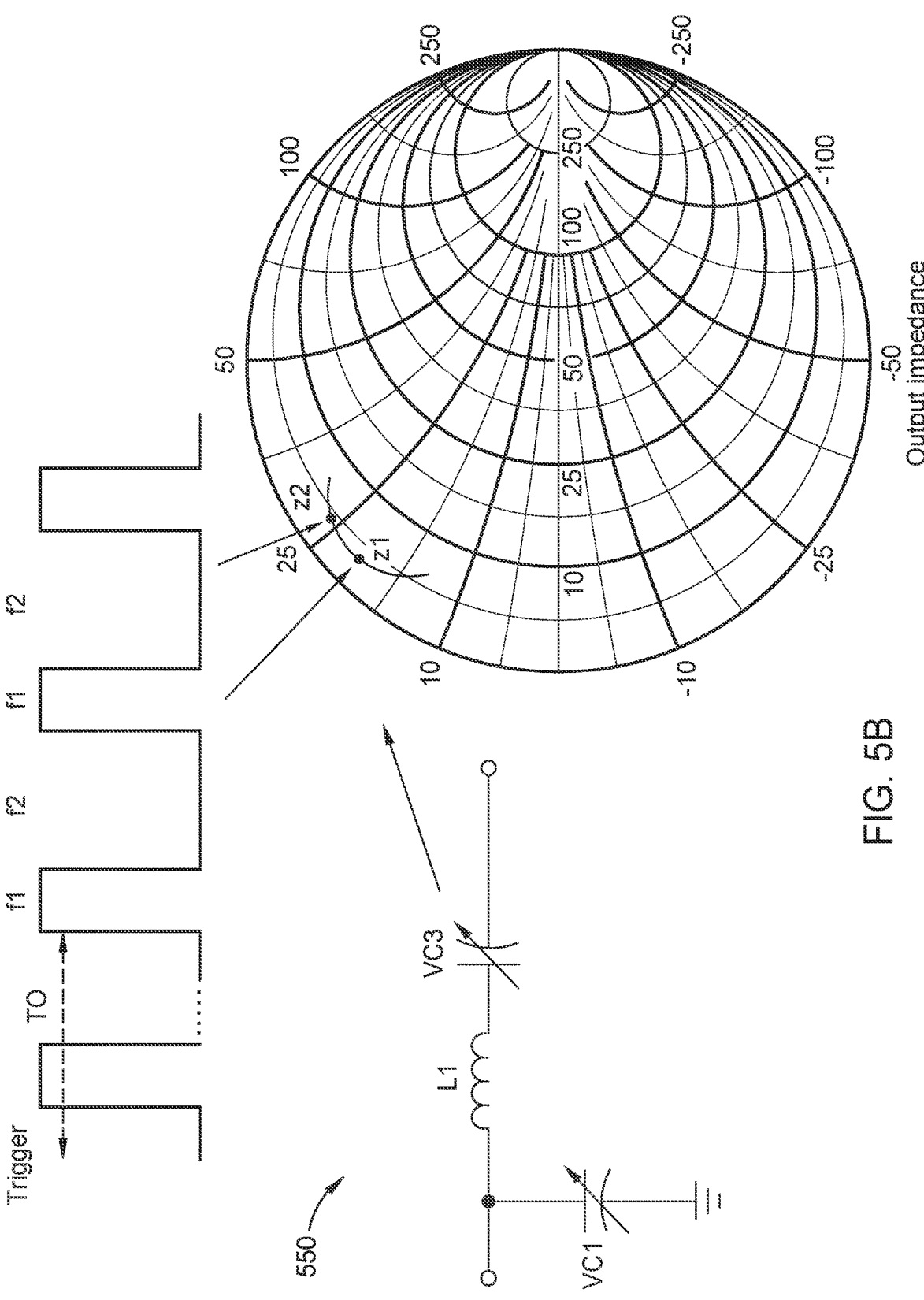
FIG. 5B illustrates an L-network tuning circuit, in accordance with certain aspects of the present disclosure.

FIG. 5B illustrates an L-network tuning circuit 550 (e.g., the third RF tuning circuit 420). The L-network tuning circuit 550 includes one or more capacitors and one inductor coupled to each other. The inductor includes the first inductor L1. The first inductor L1 may be in a range of 0.01 uH to 1000 uH. In some cases, there may be more than one inductor in the L-network tuning circuit 550. In some cases, there may be no inductor in the L-network tuning circuit 550. The one or more capacitors include two capacitors, which include a first variable capacitor VC1 and a third VC3. The capacitors may be in a range from 3 pF to 5000 pF. In some cases, there may be more than three capacitors in the L-network tuning circuit 550. In some cases, there may be less than two capacitors in the L-network tuning circuit 550. In one example, the one or more capacitors may be variable capacitors. In another example, the one or more capacitors may be fixed capacitors. In another example, the one or more capacitors may be variable as well as fixed capacitors. In another example, the one or more capacitors may be replaced by inductors.

In the L-network tuning circuit 550 illustrated in FIG. 5B, the inductor L1 is coupled to the VC3. The VC1 is coupled between the L1 and an electrical ground node. The setting values of VC1 and the VC3 may be changed along with frequency switching using an RF generator (e.g., which has a frequency tuning capability and can adjust its RF power frequency within e.g., ±5% or ±10%) to match two or more distinct impedance states in the PV waveform cycle (e.g., the impedance Z2 at the ion current stage of the PV waveform and the impedance Z1 at the sheath collapse stage of the PV waveform) at the same time.

The VC1 and the VC3 may be tuned to a first impedance Z1. For example, a controller may tune the VC1 and the VC3 to the impedance Z1. The controller may determine the impedance Z1. For example, an output sensor may sense a first set of impedance data of the PV waveform over a first period of time and report the first set of impedance data to the controller. Based on the first set of impedance data, the controller may determine impedance Z1 to be impedance at the ion current stage of the PV waveform.

The frequency may then be tuned to a second impedance Z2. For example, the controller may tune the RF generator frequency to the impedance Z2. The controller may determine the impedance Z2. For example, the output sensor may sense a second set of impedance data of the PV waveform over a second period of time and report the second set of impedance data to the controller. Based on the second set of impedance data, the controller may determine impedance Z2 to be impedance at the sheath collapse stage of the PV waveform.

In certain aspects, if a target frequency is X MHz (e.g., X=13.56 MHZ, 40 MHz or 60 MHZ), the RF generator can adjust its RF power frequency within a range of ±5% or ±10%. In operation, the RF generator may scan the frequency within the range along a frequency scan line, such that the frequency scan line passes through the impedance Z1 and the impedance Z2 at the same time. In some cases, the frequency scan line may be used to match to two or more impedances with variable capacitors, fixed capacitors, and/or inductors.

Figure 6A:
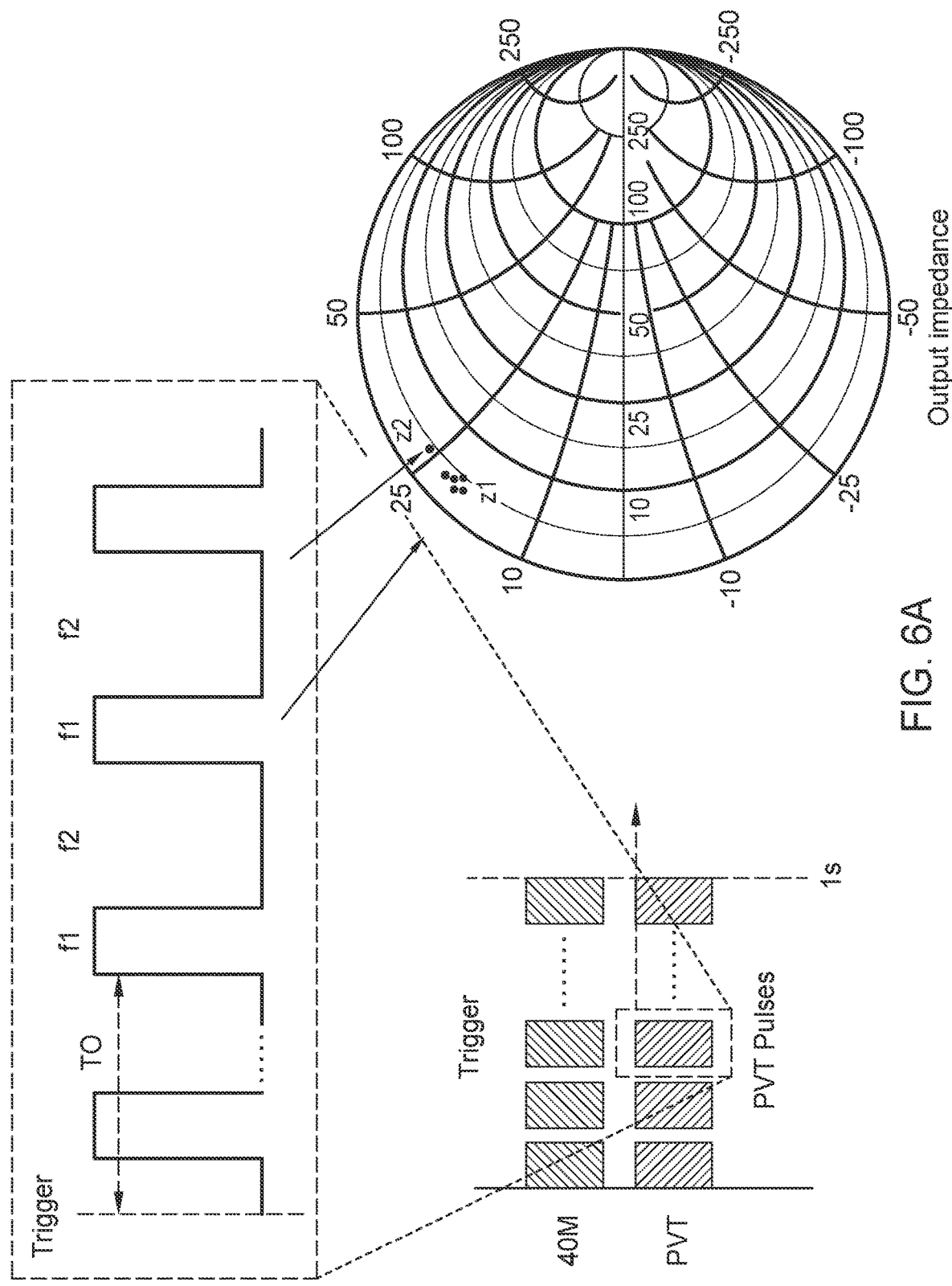
FIG. 6A illustrates two impedances Z1 and Z2 in a PV waveform cycle and triggering learning-based tuning for a fast impedance matching, in accordance with certain aspects of the present disclosure.
Figure 6B:
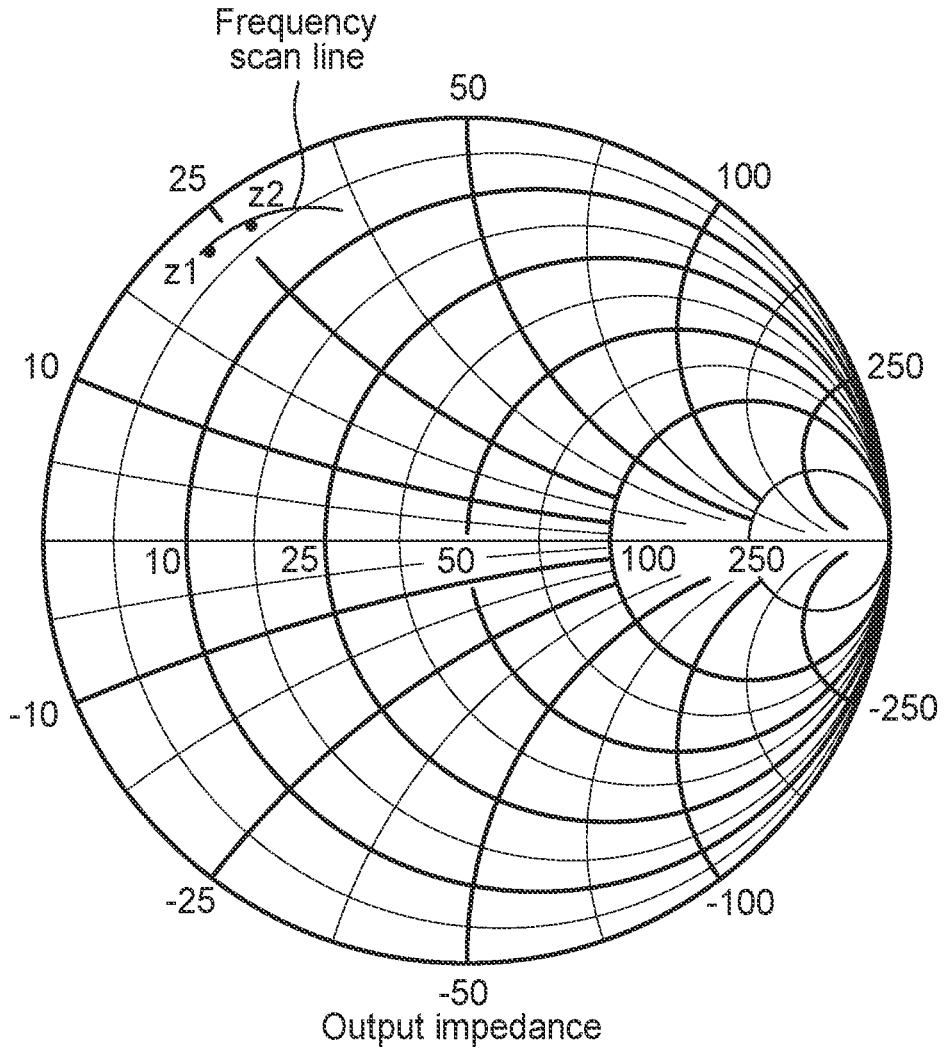
FIG. 6B illustrates the two impedances Z1 and Z2 in the PV waveform cycle, in accordance with certain aspects of the present disclosure.
Figure 6C:
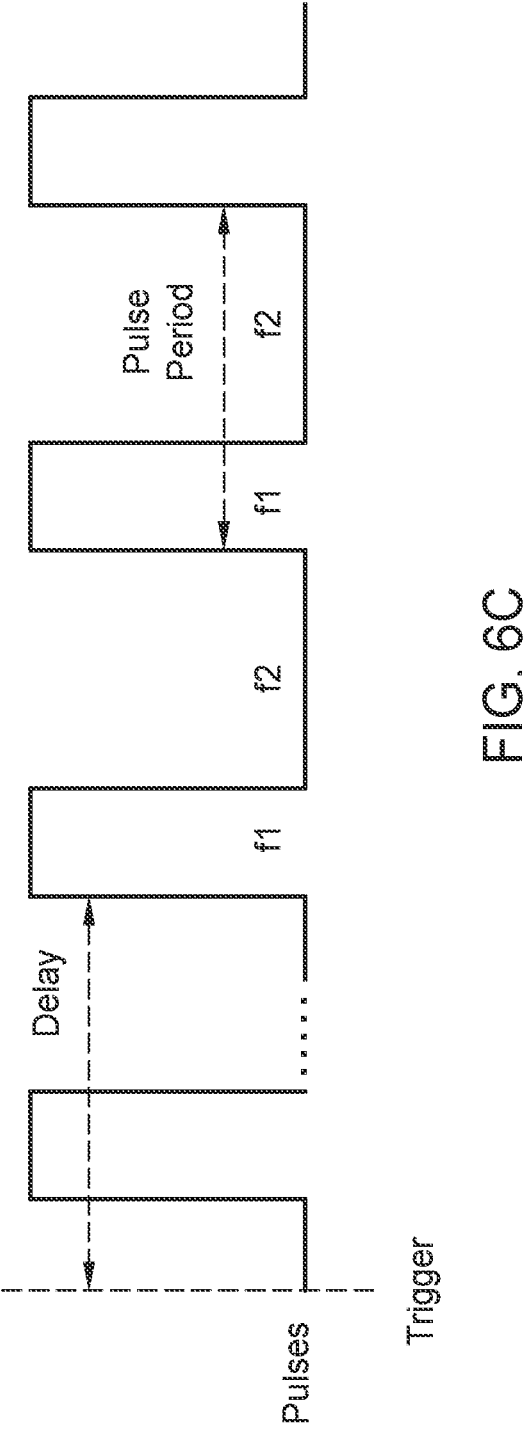
FIG. 6C illustrates the triggering of the learning-based tuning for the fast impedance matching, in accordance with certain aspects of the present disclosure.

FIGS. 6A-6C illustrate two impedances Z1 and Z2 in a PV waveform cycle and triggering learning-based tuning for fast impedance matching.

The impedance matching process includes two steps. In a first step (e.g., a learning step), setting values of the VC1, the VC2, and the VC3 (e.g., of the pi-network tuning circuit 500) and two RF generator power frequencies f1 and f2 are determined to match the two impedances Z1 and Z2. For example, initially the VC1 and the VC2 are tuned to the impedance Z1. Then the VC3 and the RF generator frequency tuning are matched to the impedance Z2.

During the learning step, a learning-based optimization algorithm controls and determines the VC1, the VC2 and the VC3. This allows the RF generator frequency tuning trajectory/scan line to pass the two impedances Z1 and Z2 at the same time. The two impedances Z1 and Z2 can then be matched with the two RF generator power frequencies f1 and f2 under a set of the VC1, the VC2 and the VC3 positions/setting values. In other words, the two preset RF generator power frequencies f1 and f2 may be used to match the two impedances Z1 and Z2, respectively. In some cases (e.g., with one or two variable capacitors), the pi-network tuning circuit 500, the L-network tuning circuit or other tuning circuits may be designed and tuned to allow the RF generator frequency tuning trajectory/scan line to pass all possible impedances at the same time.

In a subsequent step, the two RF generator power frequencies f1 and f2 are switched to match the two impedances Z1 and Z2. For example, the RF generator (e.g., based on a trigger signal) may start to switch between the two preset RF generator power frequencies f1 and f2.

The RF generator may receive or trigger the trigger signal. In one example, the trigger signal may correspond to a detected rising edge of a pulse signal. In another example, the trigger signal may correspond to a transistor-transistor logic (TTL) synchronization signal from the RF generator. In another example, the trigger signal may correspond to a TTL signal from an advanced waveform generator.

Upon receiving or triggering the trigger signal, the RF generator may start to switch between the two preset RF generator power frequencies f1 and f2 (e.g., after a certain delay time), while the VC1, the VC2, and the VC3 are kept at a fixed position, to match the two impedances Z1 and Z2.

In certain aspects, the delay time may be adjusted to align the RF generator frequency tuning with pulses of the PV waveform.

In one example, the switching timing between the two preset RF generator power frequencies f1 and f2 may depend on a pulse frequency of a PV waveform. In another example, the switching timing between the two preset RF generator power frequencies f1 and f2 may depend on a duty cycle of the pulses of the PV waveform. In another example, the switching timing between the two preset RF generator power frequencies f1 and f2 may depend on a pulse on/off time of the PV waveform. In another example, the switching timing between the two preset RF generator power frequencies f1 and f2 may depend on the pulse frequency, the duty cycle of the pulses, and the pulse on/off time of the PV waveform. In another example, the switching timing between the two preset RF generator power frequencies f1 and f2 may depend on the two impedances Z1 and Z2 to be matched.

In certain aspects, switching frequency states may be based on a number of impedance states that need to be matched. For example, there are two preset RF generator power frequencies to match two impedances. In another example, there are three preset RF generator power frequencies to match three impedances.

FIG. 7 is a process flow diagram illustrating a method 700 for learning-based impedance tuning. The method is performed by a processing logic that includes a hardware (e.g., circuitry, dedicated logic, programmable logic, microcode, processing device, etc.), a software (such as instructions run on a processing device, a general purpose computer system, or a dedicated machine), a firmware, a microcode, or a combination thereof. The method may be directly or indirectly performed, in part, by a controller device (e.g., the system controller 126 of FIG. 1A and/or the controller 302 of FIG. 3). A non-transitory storage medium stores instructions that when executed by the controller device causes the controller device to perform the method.

For simplicity of explanation, the method is depicted and described as a series of operations. However, the operations in accordance with this disclosure can occur in various orders and/or concurrently and with other operations not presented and described herein. Furthermore, in some cases, not all illustrated operations are be performed to implement the method 700 in accordance with the disclosed subject matter. In addition, those skilled in the art will understand and appreciate that the method 700 could alternatively represented as a series of interrelated states via a state diagram or events.

The method includes one or more pre-learning steps to determine discrete and required RF generator power frequencies for tuning, and an RF generator switches between the determined pre-learned RF generator power frequencies to match different impedances at different stages/states.

For example, at operation 710, tune VC1 and VC2 of a tuning circuit (e.g., the pi-network tuning circuit 500) to match a first impedance Z1 corresponding to a first stage of a waveform (e.g., while a frequency of an RF generator is preset to a first frequency and a VC3 of the tuning circuit is preset).

In certain aspects, a PV generator may deliver the waveform to an electrode disposed within a plasma processing system. The waveform corresponds to a PV waveform. The first stage of the waveform corresponds to an ion current stage of the PV waveform. The first impedance Z1 is measured over a first time period corresponding to the ion current stage of the PV waveform. The first impedance Z1 is an average impedance of the plasma processing system during the first time period.

At operation 720, tune VC3 of the tuning circuit and the frequency of the RF generator to match a second impedance Z2 corresponding to a second stage of the waveform (e.g., while the VC1 and the VC2 are kept in tuned positions that match the first impedance Z1). The frequency of the RF generator is tuned to a second frequency. One will note that operation 720 can be useful when a pi-type tuning circuit, as shown in FIGS. 4A and 4B, is provided as the tuning circuit.

The second stage of the waveform corresponds to a sheath collapse stage of the PV waveform. The second impedance Z2 is measured over a second time period corresponding to the sheath collapse stage of the PV waveform. The second impedance Z2 is an average impedance of the plasma processing system during the second time period. A duration of the first time period is more than a duration of the second time period.

In some embodiments, after performing operation 720, operation 710 and/or operation 720 is completed at least one more time to optimize the various variable capacitor and frequency settings in an effort to improve at least one characteristic of the RF power delivered to a plasma generated in the processing chamber. In one example, due to the interaction between the variable capacitor settings of VC1, VC2 and VC3, operation 710 and operation 720 are both completed at least one more time to improve the various variable capacitor and frequency settings in an effort to reduce the amount of reflected power generated at each of the initial settings created during the first time operations 710 and 720 were completed.

At operation 730, record setting values of the first frequency and the second frequency that match different impedances at different stages of the waveform. For example, record the tuning positions of the first capacitor, the second capacitor, and the third capacitor and also the first frequency and second frequency settings at the different stages of the waveform that match the different impedances at the different stages of the waveform. The process of recording the setting values can include storing the setting values in memory.

At operation 740, switch between the first frequency and the second frequency to match the different impedances at the different stages of the waveform (e.g., in response to the receiving a synchronization signal). In one example, the RF generator may switch to the first frequency (e.g., while the first capacitor, the second capacitor, and the third capacitor are at their tuned positions) to match the first impedance corresponding to the first stage of the waveform. In another example, the RF generator may switch to the second frequency (e.g., while the first capacitor, the second capacitor, and the third capacitor are at their tuned positions) to match the second impedance corresponding to the second stage of the waveform. Operation 740 can include switching between the first frequency and the second frequency to match the different impedances at the different stages of the waveform using the settings of the first capacitor, the second capacitor and third capacitor set during operations 710 and 720.

FIG. 8 is a process flow diagram illustrating a method 800 for learning-based impedance tuning utilizing a tuning circuit that includes two variable capacitors that can be used to tune to different impedance states. The method 800 can be performed by a processing logic that includes a hardware (e.g., circuitry, dedicated logic, programmable logic, microcode, processing device, etc.), a software (such as instructions run on a processing device, a general purpose computer system, or a dedicated machine), a firmware, a microcode, or a combination thereof. The method may be directly or indirectly performed, in part, by a controller device (e.g., the system controller 126 of FIG. 1A and/or the controller 302 of FIG. 3). A non-transitory storage medium stores instructions that when executed by the controller device causes the controller device to perform the method.

The method 800 includes one or more pre-learning steps to determine discrete and required RF generator power frequencies for tuning, and an RF generator switches between the determined pre-learned RF generator power frequencies to match different impedances at different stages/states.

For example, at operation 810, tune VC1 and VC2 of a tuning circuit (e.g., the L-network tuning circuit 550) to match a first impedance Z1 corresponding to a first stage of a waveform, while a frequency of an RF generator is preset to a first frequency.

In certain aspects, a PV generator may deliver the waveform to an electrode disposed within a plasma processing system. The waveform corresponds to a PV waveform. The first stage of the waveform corresponds to an ion current stage of the PV waveform. The first impedance Z1 is measured over a first time period corresponding to the ion current stage of the PV waveform. The first impedance Z1 is an average impedance of the plasma processing system during the first time period.

At operation 820, the frequency of the RF generator is altered to match a second impedance Z2 corresponding to a second stage of the waveform (e.g., while the VC1 and the VC2 are kept in tuned positions that match the first impedance Z1). The frequency of the RF generator in operation 820 is thus tuned to a second frequency. One will note that operations 810 and 820 can be useful when an L-type tuning circuit, as shown in FIGS. 4C, is provided as the tuning circuit.

The second stage of the waveform corresponds to a sheath collapse stage of the PV waveform. The second impedance Z2 is measured over a second time period corresponding to the sheath collapse stage of the PV waveform. The second impedance Z2 is an average impedance of the plasma processing system during the second time period. A duration of the first time period is more than a duration of the second time period.

In some embodiments, after performing operation 820, operation 810 and operation 820 may both be completed at least one more time to optimize the various variable capacitor and frequency settings in an effort to improve at least one characteristic of the RF power delivered to a plasma generated in the processing chamber. In one example, operation 810 and operation 820 are completed at least one more time to improve the various variable capacitor and frequency settings in an effort to reduce the amount of reflected power generated at each of the initial settings created during the first time operations 810 and 820 were completed.

At operation 830, setting values of the first frequency and the second frequency that match different impedances at different stages of the waveform are recorded. For example, record the tuning positions of the first capacitor and the second capacitor, and also the first frequency and second frequency settings at the different stages of the waveform that match the different impedances at the different stages of the waveform. The process of recording the setting values can include storing the setting values in memory.

At operation 840, during processing switch between the first frequency and the second frequency to match the different impedances at the different stages of the waveform (e.g., in response to the receiving a synchronization signal). In one example, the RF generator may switch to the first frequency (e.g., while the first capacitor and the second capacitor are at their tuned positions) to match the first impedance corresponding to the first stage of the waveform. In another example, the RF generator may switch to the second frequency (e.g., while the first capacitor and the second capacitor remain at their tuned positions) to match the second impedance corresponding to the second stage of the waveform. Operation 840 can include switching between the first frequency and the second frequency to match the different impedances at the different stages of the waveform using the settings of the first capacitor and the second capacitor set during operations 810 and 820.

It is believed that a process that includes switching between the known frequencies, such as the first frequency and second frequency to account for varying impedances, allows for an improved rapid adjustment and/or rapid compensation for changing impedances, versus other conventional methods that utilize a process of sweeping the RF frequency and/or adjusting the impedance producing elements, such as the variable capacitors, to compensate for the varying impedances.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate in a plasma processing system, comprising:
    tuning a first capacitor and a second capacitor of a tuning circuit to match a first impedance corresponding to a first stage of a waveform, while a frequency of a radio frequency (RF) generator is preset to a first frequency;
    tuning a third capacitor of the tuning circuit and the frequency of the RF generator to match a second impedance corresponding to a second stage of the waveform, wherein the frequency of the RF generator is tuned to a second frequency, and the first stage and the second stage are different stages of the waveform;
    recording setting values of the first frequency and the second frequency that match the first impedance and second impedance, respectively; and
    switching between the first frequency and the second frequency to match the different impedances at different stages of the waveform using settings of the first capacitor, the second capacitor and the third capacitor set by the tuning of first capacitor and the second capacitor to match the first impedance and the tuning of third capacitor to match the second impedance.

2. The method of claim 1, further comprising delivering, by a pulsed voltage (PV) waveform generator, the waveform to an electrode disposed within the plasma processing system, wherein the waveform corresponds to a PV waveform.

3. The method of claim 2, wherein the first stage of the waveform corresponds to an ion current stage of the PV waveform and the second stage of the waveform corresponds to a sheath collapse stage of the PV waveform.

4. The method of claim 3, further comprising determining the first impedance corresponding to the ion current stage of the PV waveform and the second impedance corresponding to the sheath collapse stage of the PV waveform.

5. The method of claim 4, wherein the determining further comprises measuring the first impedance over a first time period corresponding to the ion current stage of the PV waveform and the second impedance over a second time period corresponding to the sheath collapse stage of the PV waveform.

6. The method of claim 5, wherein a duration of the first time period is more than a duration of the second time period.

7. The method of claim 5, wherein the first impedance is an average impedance of the plasma processing system during the first time period, and the second impedance is an average impedance of the plasma processing system during the second time period.

8. The method of claim 1, wherein the switching further comprises switching to the first frequency to match the first impedance corresponding to the first stage of the waveform.

9. The method of claim 1, wherein the switching further comprises switching to the second frequency to match the second impedance corresponding to the second stage of the waveform.

10. The method of claim 1, wherein the tuning the first capacitor and the second capacitor further comprises tuning the first capacitor and the second capacitor to match the first impedance, while a setting value of the third capacitor is preset.

11. The method of claim 10, wherein the tuning the third capacitor and the frequency of the RF generator further comprises tuning the third capacitor and the frequency of the RF generator to match the second impedance, while the first capacitor and the second capacitor are maintained in current tuned positions that match the first impedance.

12. The method of claim 1, wherein the recording comprises:
   recording tuned positions of the first capacitor, the second capacitor, and the third capacitor at the different stages of the waveform to match the different impedances at the different stages of the waveform, and
   the recording of the tuned positions is performed at least once during the different stages of the waveform.

13. The method of claim 1, further comprising:
   receiving a synchronization signal from the RF generator or a pulsed voltage (PV) waveform generator, and
   the switching comprises switching between the first frequency and the second frequency to match the different impedances at the different stages of the waveform, in response to the receiving the synchronization signal.

14. The method of claim 1, further comprising switching between a plurality of frequencies comprising at least the first frequency and the second frequency using the RF generator to match a plurality of discrete impedances comprising at least the first impedance and the second impedance at the different stages of the waveform.

15. A plasma processing chamber comprising:
   a match comprising a tuning circuit that comprises a first capacitor and a second capacitor;
   an RF generator having an RF power output and coupled to a first electrode within the plasma processing chamber;
   a controller; and
   a memory for storing a program to be executed in the controller, the program comprising instructions which when executed cause the following:
      tuning the first capacitor and the second capacitor of the tuning circuit to match a first impedance corresponding to a first stage of a waveform, while a frequency of a radio frequency (RF) generator is preset to a first frequency;
      tuning a third capacitor of the tuning circuit and the frequency of the RF generator to match a second impedance corresponding to a second stage of the waveform, wherein the frequency of the RF generator is tuned to a second frequency, and the first stage and the second stage are different stages of the waveform;
   recording setting values of the first frequency and the second frequency that match the first impedance and second impedance, respectively; and
   switching between the first frequency and the second frequency to match different impedances at different stages of the waveform using settings of the first capacitor, the second capacitor and the third capacitor set by the tuning of first capacitor and the second capacitor to match the first impedance and the tuning of third capacitor to match the second impedance.

16. The plasma processing chamber of claim 15, further comprising:
   a voltage waveform generator configured to deliver a voltage waveform to an electrode assembly disposed within the plasma processing chamber; and
   wherein the instructions, when executed, also cause delivering, by the voltage waveform generator, the voltage waveform to a second electrode disposed within the plasma processing system.

17. The plasma processing chamber of claim 16, wherein:
   the voltage waveform comprises a first asymmetric pulsed voltage (PV) waveform, and
   the first stage of the first asymmetric PV waveform corresponds to an ion current stage and the second stage of the first asymmetric PV waveform corresponds to a sheath collapse stage.

18. A method of processing a substrate in a plasma processing system, comprising:
   tuning a first capacitor and a second capacitor of a tuning circuit to match a first impedance corresponding to a first stage of a waveform, while a frequency of a radio frequency (RF) generator is preset to a first frequency;
   tuning the frequency of the RF generator to match a second impedance corresponding to a second stage of the waveform, wherein the frequency of the RF generator is tuned to a second frequency, and the first stage and the second stage are different stages of the waveform;
   recording setting values of the first frequency and the second frequency that match the first impedance and second impedance, respectively; and
   switching between the first frequency and the second frequency to match the different impedances at different stages of the waveform using settings of the first capacitor and the second capacitor set by the tuning of first capacitor and the second capacitor to match the first impedance.

19. The method of claim 18, further comprising delivering, by a pulsed voltage (PV) waveform generator, the waveform to an electrode disposed within the plasma processing system, wherein
   the waveform corresponds to a PV waveform, and
   the first stage of the waveform corresponds to an ion current stage of the PV waveform and the second stage of the waveform corresponds to a sheath collapse stage of the PV waveform.

20. The method of claim 18, further comprising:
   receiving a synchronization signal from the RF generator or a pulsed voltage (PV) waveform generator, and
   the switching comprises switching between the first frequency and the second frequency to match the different impedances at the first and second stages of the wave-form, in response to the receiving the synchronization signal.

* * * * *